United States Patent
Kim et al.

(10) Patent No.: US 11,710,431 B2
(45) Date of Patent: Jul. 25, 2023

(54) MANUFACTURING METHOD OF DISPLAY APPARATUS, INTERPOSER SUBSTRATE, AND COMPUTER PROGRAM STORED IN READABLE MEDIUM

(71) Applicant: SAMSUNG ELECTRONICS CO., LTD., Suwon-si (KR)

(72) Inventors: Byungchul Kim, Suwon-si (KR); Doyoung Kwag, Suwon-si (KR); Sangmoo Park, Suwon-si (KR); Minsub Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 224 days.

(21) Appl. No.: 17/070,581

(22) Filed: Oct. 14, 2020

(65) Prior Publication Data
US 2021/0110748 A1    Apr. 15, 2021

(30) Foreign Application Priority Data

Oct. 15, 2019   (KR) .......................... 10-2019-0127573

(51) Int. Cl.
*G09G 3/00*     (2006.01)
*H01L 27/15*    (2006.01)
*H01L 33/38*    (2010.01)
*H01L 33/62*    (2010.01)

(52) U.S. Cl.
CPC ........... *G09G 3/006* (2013.01); *H01L 27/156* (2013.01); *H01L 33/38* (2013.01); *H01L 33/62* (2013.01)

(58) Field of Classification Search
CPC ....... H01L 33/38; H01L 33/62; H01L 27/156; G09G 3/006
See application file for complete search history.

(56) References Cited

U.S. PATENT DOCUMENTS

| 2006/0154390 A1 | 7/2006 | Tran et al. |
| 2016/0300745 A1 | 10/2016 | Chang et al. |
| 2017/0140961 A1 | 5/2017 | Sasaki et al. |

(Continued)

FOREIGN PATENT DOCUMENTS

| JP | 2006-140398 A | 6/2006 |
| JP | 4450067 B2 | 4/2010 |

(Continued)

OTHER PUBLICATIONS

International Search Report dated Jan. 27, 2019 by the International Searching Authority in International Patent Application No. PCT/KR2020/013768.

(Continued)

*Primary Examiner* — Kenneth B Lee, Jr.
(74) *Attorney, Agent, or Firm* — Sughrue Mion, PLLC

(57) ABSTRACT

A method of manufacturing a display apparatus includes performing a first repair process of detecting a first defective light emitting diode (LED) from among a plurality of LEDs provided on a sapphire substrate and removing the first defective LED; attaching the plurality of LEDs to electrode patterns of an interposer substrate and separating the sapphire substrate from the plurality of LEDs; and performing a second repair process of detecting a second defective LED among the plurality of LEDs attached to the electrode patterns and replacing the second defective LED.

20 Claims, 21 Drawing Sheets

(56) References Cited

U.S. PATENT DOCUMENTS

| | | |
|---|---|---|
| 2017/0256522 A1 | 9/2017 | Cok et al. |
| 2017/0263811 A1 | 9/2017 | Zou et al. |
| 2018/0254226 A1* | 9/2018 | Iguchi .................. H01L 27/156 |
| 2018/0259570 A1 | 9/2018 | Henley |
| 2019/0181060 A1 | 6/2019 | Pappas et al. |
| 2021/0028074 A1* | 1/2021 | Park ........................ H01L 33/62 |

FOREIGN PATENT DOCUMENTS

| | | |
|---|---|---|
| JP | 2019-138949 A | 8/2019 |
| KR | 10-2013-0130567 A | 12/2013 |
| KR | 10-1953645 B1 | 3/2019 |
| KR | 10-2019-0112615 A | 10/2019 |
| WO | 2019/027248 A1 | 2/2019 |
| WO | 2019190102 A1 | 10/2019 |

OTHER PUBLICATIONS

Communication dated Jul. 27, 2022 issued by the European Patent Office in European Application No. 20875735.1.
Communication dated Nov. 8, 2022 by the European Patent Office in European Patent Application No. 20875735.1.

* cited by examiner

MANUFACTURING METHOD OF DISPLAY APPARATUS, INTERPOSER SUBSTRATE, AND COMPUTER PROGRAM STORED IN READABLE MEDIUM

CROSS-REFERENCE TO RELATED APPLICATION(S)

This application is based on and claims priority under 35 U.S.C. § 119 to Korean Patent Application No. 10-2019-0127573, filed on Oct. 15, 2019, in the Korean Intellectual Property Office, the disclosure of which is incorporated by reference herein in its entirety.

BACKGROUND

1. Field

The disclosure relates to a manufacturing method of a display apparatus, and more particularly to a manufacturing method that provides an image using light emitting diodes, an interposer substrate used in a manufacturing process of the display apparatus, and a computer program stored in a readable medium to execute the manufacturing method of the display apparatus.

2. Description of Related Art

A display apparatus may be categorized as either an emissive display in which each pixel is self-luminous or a non-emissive display that requires separate light sources.

A liquid crystal display (LCD), which is still widely used, is a typical non-emissive display. Since the non-emissive display needs a backlight unit that supplies light from a rear of a display panel, a liquid crystal layer that acts as a switch to pass/block light, and a color filter that changes the supplied light into a desired color, it is structurally complex and is limited in implementing a thin thickness.

On the other hand, since the emissive display in which each pixel emits light by having a light emitting element for each pixel does not need components such as the backlight unit, the liquid crystal layer, and the color filter, it is structurally simple, has a high degree of design freedom, and may be implemented with a thin thickness. In addition, the emissive display may provide better contrast ratio, brightness, and viewing angle.

A micro light emitting diode (micro LED, µLED) display panel is a flat panel display and is composed of a plurality of inorganic LEDs each of 100 micrometers or less. Compared to liquid crystal display (LCD) panels that require backlighting, the micro LED display panels provide better contrast, response time and energy efficiency. Both the organic LEDs and micro LEDs, which are inorganic light emitting elements, have good energy efficiency, but the micro LEDs are superior to OLEDs in brightness and emitting efficiency and have a longer lifespan.

SUMMARY

Provided is a manufacturing method of a display apparatus capable of more accurately detecting a defective light emitting diode during a process of manufacturing the display apparatus and minimizing a defect rate of the display apparatus.

In accordance with an aspect of the disclosure, there is provided a method of manufacturing a display apparatus including: performing a first repair process of detecting a first defective light emitting diode (LED) from among a plurality of LEDs provided on a sapphire substrate and removing the first defective LED; attaching the plurality of LEDs to electrode patterns of an interposer substrate and separating the sapphire substrate from the plurality of LEDs; and performing a second repair process of detecting a second defective LED among the plurality of LEDs attached to the electrode patterns and replacing the second defective LED.

The method may further include: attaching the plurality of LEDs, that are attached to the electrode patterns of the interposer substrate, to a carrier substrate and separating the interposer substrate from the plurality of LEDs; transferring the plurality of LEDs attached to the carrier substrate to a backplane; and performing a third repair process of detecting a third defective LED among the plurality of LEDs transferred to the backplane and repairing a subpixel corresponding to the third defective LED.

The first repair process may include detecting the first defective LED by performing a photoluminescence (PL) inspection.

An adhesive material may be provided over the electrode patterns of the interposer substrate or the electrode patterns may be provided on the adhesive material applied to the interposer substrate.

The attaching of the plurality of LEDs to the electrode patterns of the interposer substrate may include: connecting an anode of each of the plurality of LEDs to a first electrode of the electrode patterns; and connecting a cathode of each of the plurality of LEDs to a second electrode of the electrode patterns.

The second repair process may include, based on the first defective LED being removed in the first repair process, attaching a first repair LED to the electrode patterns of the interposer substrate and then performing an electroluminescence (EL) inspection.

The second repair process may further include, based on the second defective LED being detected by performing the EL inspection, replacing the second defective LED with a second repair LED.

The backplane may include main areas in which the plurality of LEDs are disposed, and a repair area in which a third repair LED is mountable.

The backplane may include: a plurality of anode pads configured to be connected to anodes of the plurality of LEDs; repair anode pads; and at least one cathode pad configured to be connected to cathodes of the plurality of LEDs and be connected to a cathode of the third repair LED.

The third repair process may include: performing an electroluminescence (EL) inspection; and mounting the third repair LED corresponding to the third defective LED in the repair area.

The third repair process may further include cutting the third defective LED.

According to an aspect of the disclosure, there is provided an interposer substrate including: a substrate; electrode patterns provided on the substrate and configured to be connected to a plurality of light emitting diodes (LEDs) provided on a sapphire substrate and to supply power to the plurality of LEDs; and an adhesive material configured to provide an adhesive force for attaching the plurality of LEDs to the electrode patterns.

The adhesive material may be disposed over the electrode patterns.

The adhesive material may be disposed between the substrate and the electrode patterns.

The electrode patterns may include: a first electrode configured to be connected to an anode of each of the plurality of LEDs; and a second electrode configured to be connected to a cathode of each of the plurality of LEDs.

According to an aspect of the disclosure, there is provided non-transitory computer readable recording medium storing a computer program which is executed by a computing device to perform a method of manufacturing a display apparatus, the method including: performing a first repair process of detecting a first defective LED from among the plurality of LEDs provided on a sapphire substrate and removing the first defective LED; attaching the plurality of LEDs to electrode patterns of an interposer substrate and separating the sapphire substrate from the plurality of LEDs; and performing a second repair process of detecting a second defective LED among the plurality of LEDs attached to the electrode patterns and replacing the second defective LED.

The method further may include: attaching the plurality of LEDs, that are attached to the electrode patterns of the interposer substrate, to a carrier substrate and separating the interposer substrate from the plurality of LEDs; transferring the plurality of LEDs attached to the carrier substrate to a backplane; and performing a third repair process of detecting a third defective LED among the plurality of LEDs transferred to the backplane and repairing a sub-pixel corresponding to the third defective LED.

The performing of the first repair process may include: detecting the first defective LED by performing a photoluminescence (PL) inspection.

The performing of the second repair process may include: based on the first defective LED being removed in the first repair process, attaching a first repair LED to the electrode patterns of the interposer substrate and then performing an electroluminescence (EL) inspection; and based on the second defective LED being detected by performing the EL inspection, replacing the second defective LED with a second repair LED.

The performing of the third repair process may include: performing an electroluminescence inspection; and mounting a third repair LED corresponding to the third defective LED in a repair area of the backplane.

BRIEF DESCRIPTION OF THE DRAWINGS

The above and other aspects, features, and advantages of certain embodiments of the present disclosure will become more apparent from the following description taken in conjunction with the accompanying drawings, in which.

DETAILED DESCRIPTION

Figure 1:
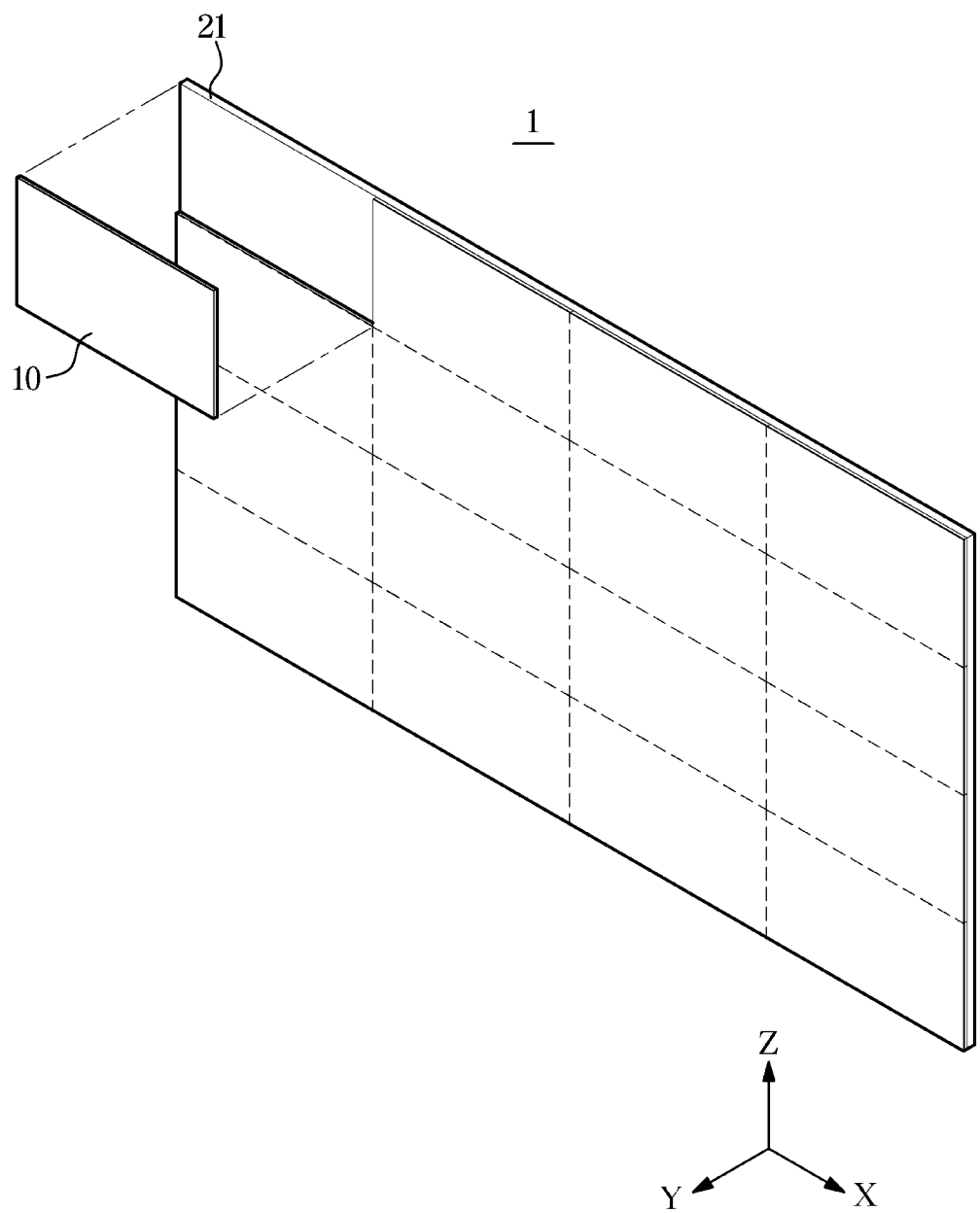
FIG. 1 is a perspective view illustrating an example of a display apparatus according to an embodiment.

Embodiments and features as described and illustrated in the disclosure are merely examples, and there may be various modifications replacing the embodiments and drawings at the time of filing this application.

Like reference numerals refer to like elements throughout the specification. Not all elements of the embodiments of the disclosure will be described, and the description of what are commonly known in the art or what overlap each other in the exemplary embodiments will be omitted. The terms as used throughout the specification, such as "~part," "~module," "~member," "~block," etc., may be implemented in software and/or hardware, and a plurality of "~parts," "~modules," "~members," or "~blocks" may be implemented in a single element, or a single "~part," "~module," "~member," or "~block" may include a plurality of elements.

It will be further understood that the term "connect" and its derivatives refer both to direct and indirect connection, and the indirect connection includes a connection over a wireless communication network.

The terms "include (or including)" and "comprise (or comprising)" are inclusive or open-ended and do not exclude additional, unrecited elements or method steps, unless otherwise mentioned. The term "member" and its derivatives refer both to when a member is in contact with another member and when another member exists between the two members.

Further, when it is stated that a layer is "on" another layer or substrate, the layer may be directly on another layer or substrate or a third layer may be disposed therebetween.

Although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section.

The singular forms "a," "an," and "the" include plural references unless the context clearly dictates otherwise.

Reference numerals used for method steps are merely used for convenience of explanation, but not to limit an order of the steps. Thus, unless the context clearly dictates otherwise, the written order may be practiced otherwise. The relative size and depiction of these elements are not necessarily to scale and may be exaggerated for clarity, illustration, and convenience.

Hereinafter, embodiments of a display apparatus and a method of manufacturing method the display apparatus according to an embodiment will be described in detail with reference to the accompanying drawings.

Figure 2:
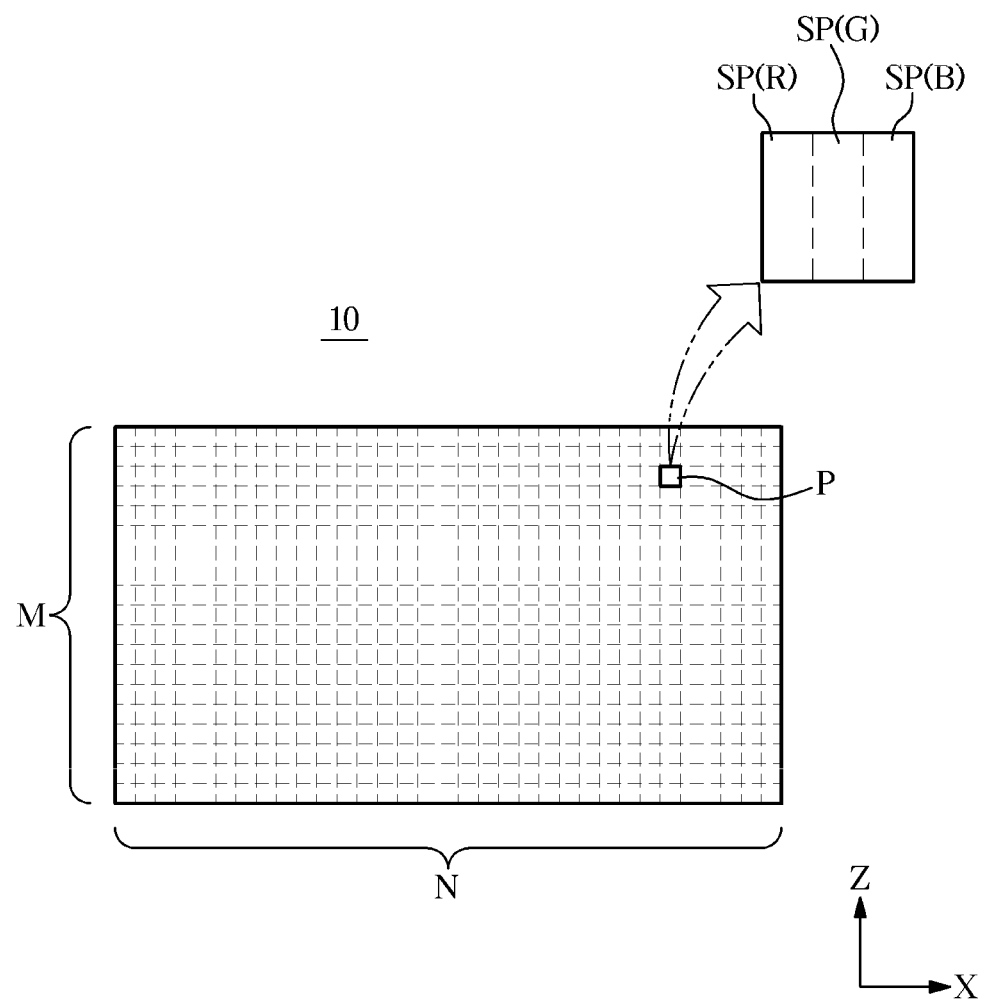
FIG. 2 is a an example diagram showing pixels constituting a unit module of a display apparatus according to an embodiment.

FIG. 1 is a perspective view showing a display apparatus according to an embodiment, and FIG. 2 is a plan view of a unit module of a display apparatus according to an embodiment.

The display apparatus 1 may correspond to an emissive display apparatus in which a light emitting diode is provided for each pixel P so that each pixel P is self-luminous.

Unlike a liquid crystal display apparatus, since the display apparatus 1 does not require components such as a backlight unit, a liquid crystal layer, and a polarizing plate, the display apparatus 1 may have a thin thickness and a simple structure, so that various designs are possible.

The light emitting diode disposed in a pixel P of the display apparatus 1 may be implemented as an inorganic material. Inorganic light emitting diodes have a faster reaction speed than organic light emitting diodes (OLEDs), and may implement high luminance with a low power. In addition, the OLEDs are vulnerable to moisture exposure and oxygen, and require a sealing process due to poor durability, whereas the inorganic light emitting diodes do not require the sealing process and have strong durability.

The light emitting diode employed in the display apparatus 1 may be a micro LED having a short side length within 250 μm. In this way, by using a micro-unit LED, a pixel size is reduced and high resolution may be implemented.

The display apparatus 1, which may have an ultra-small pixel and a thin thickness due the micro LED, may be applied to various fields. For example, as shown in FIG. 1, a plurality of display modules 10 may be tiled and installed in a cabinet 21, thereby providing a large screen. The display module 10 may be manufactured by transferring a plurality of micro LEDs to a substrate.

A 3D coordinate system of a XYZ axis illustrated in FIG. 1 is based on the display apparatus 1. A plane on which the screen of the display apparatus 1 is located is a XZ plane, and a direction in which an image is output or the light emitting diode emits light is in a positive Y direction.

Referring to FIG. 2, the display module 10 may have pixels in an M×N (M, N are integers of 2 or more) array, and the unit pixel P may be three subpixels SP(R), SP(G), and SP(B) corresponding to R, G, B, respectively.

However, the structures of FIGS. 1 and 2 are only examples embodiments of the display apparatus 1, and the display apparatus 1 does not necessarily have to be manufactured by tiling the plurality of unit modules 10. The display apparatus 1 may include an M×N pixel array without a tiling process.

In addition, the unit pixel P does not have to be composed of the red subpixel SP(R) that emits red light, the green subpixel SP(G) that emits green light, and the blue subpixel SP(B) that emits blue light. A subpixel that emits yellow or white light may be included.

In the embodiments to be described later, an example embodiment where the unit pixel P is composed of the red subpixel SP(R) that emits red light, the green subpixel SP(G) that emits green light, and the blue subpixel SP(B) that emits blue light will be described.

Figure 3:
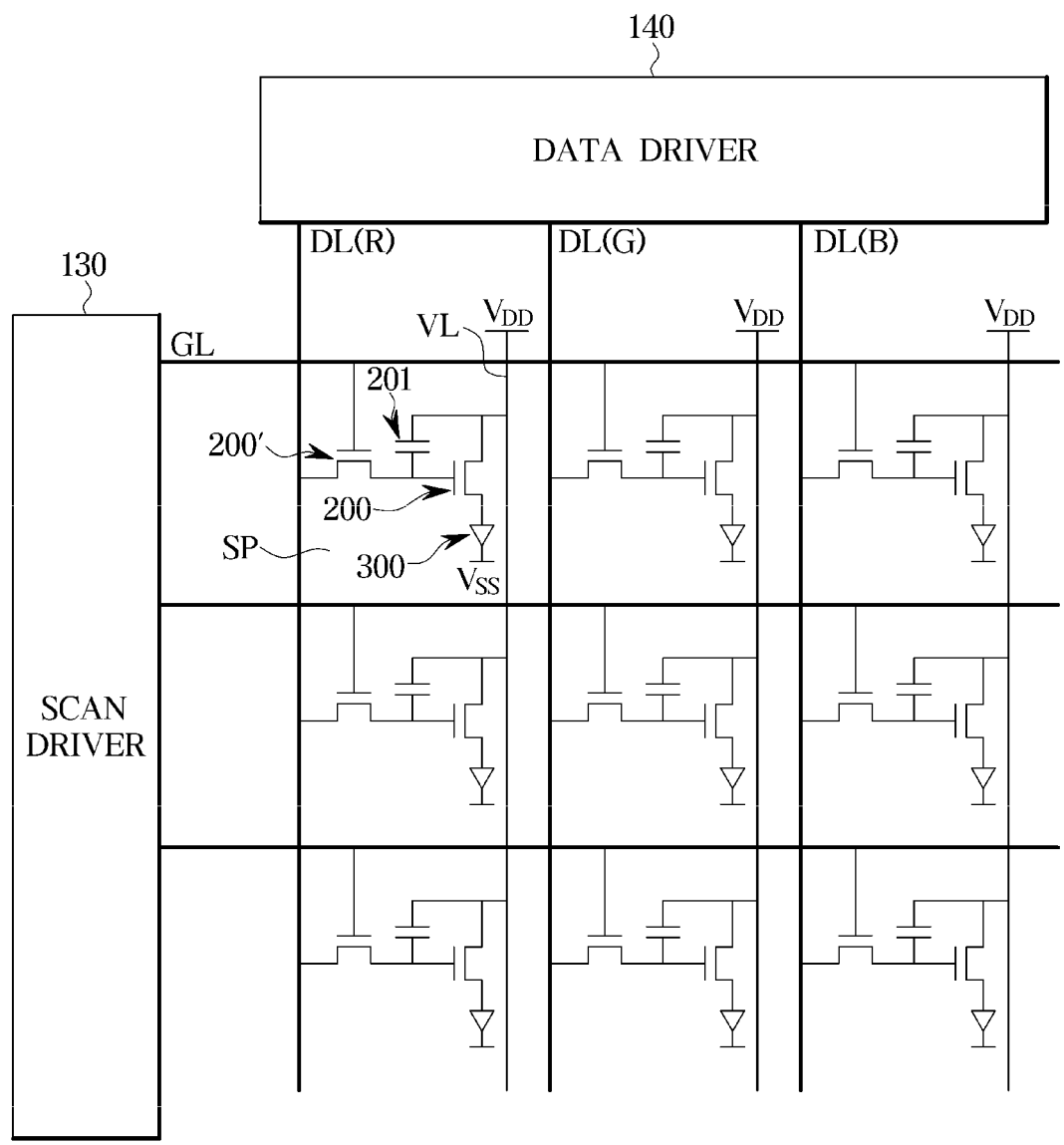
FIG. 3 is a schematic diagram of a thin-film transistor driving circuit that individually drives pixels of a display apparatus according to an embodiment.
Figure 4:
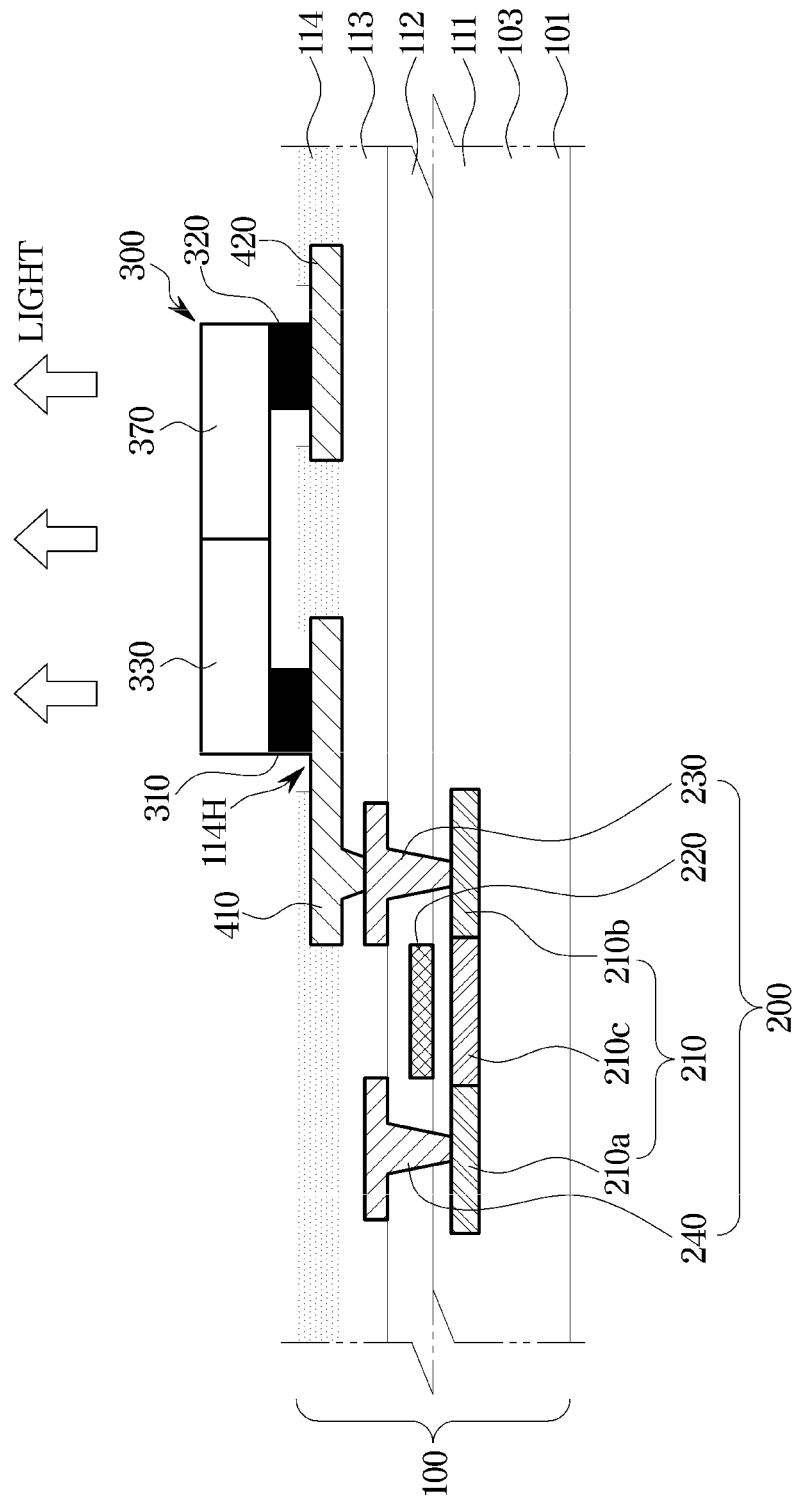
FIG. 4 is a cross-sectional view of a subpixel of a display apparatus according to an embodiment.

FIG. 3 is a schematic view of a thin film transistor (TFT) driving circuit that individually drives pixels of a display apparatus according to an embodiment, and FIG. 4 is a cross-sectional view of a subpixel of a display apparatus according to an embodiment.

Referring to FIG. 3, the TFT may include a plurality of data lines DL, a plurality of power lines VL, and a plurality of gate lines GL. The gate lines GL may be arranged in a row direction, and a the data lines DL may be arranged in a column direction to provide an electrode pattern. Regions partitioned by the data line DL and the gate lines GL may correspond to a subpixel SP.

The data line DL may transmit a data signal corresponding to the image to the subpixel SP, and the gate line GL may transmit a scan signal for turning on/off the subpixel SP to the subpixel SP. The power line VL may supply a power voltage $V_{DD}$ to the subpixel SP for a time period corresponding to one frame.

When a scan driver 130 applies the scan signal to the gate line GL, the subpixel SP connected to the gate line GL to which the scan signal is applied may be turned on. When the data driver 140 applies the data voltage $V_{DATA}$ corresponding to the image signal to the data line DL, the data voltage $V_{DATA}$ may be input to the turned-on subpixel SP among the subpixels connected to the data line DL.

The scan driver 130 and the data driver 140 may be electrically connected to a backplane 100. For example, the scan driver 130 and the data driver 140 may be mounted on a tape carrier package (TCP) in the form of a chip, or may be mounted on a flexible printed circuit (FPC) or a film in the form of the chip. Also, the scan driver 130 and the data driver 140 may be directly mounted under the backplane 100. The backplane 100 may be referred to as a TFT substrate.

A light emitting diode 300 may be provided for each subpixel SP, and the TFT driving circuit for driving the light emitting diode 300 may include a switching transistor 200', a driving transistor 200, and a capacitor 201.

The switching transistor 200' and the driving transistor 200 may be implemented as PMOS type transistors. However, the disclosure is not limited thereto, and the switching transistor 200' and the driving transistor 200 may be implemented as NMOS type transistors.

A gate electrode of the switching transistor 200' may be connected to the gate line GL, a source electrode of the switching transistor 200' may be connected to the data line DL, and a drain electrode of the switching transistor 200' may be connected to one end of the capacitor 201 and the gate electrode of the driving transistor 200. The other end of the capacitor 201 may be connected to the power line VL.

Referring to FIG. 4, a source electrode 240 of the driving transistor 200 may be connected to the power line (VL), and a drain electrode 230 of the driving transistor 200 may be connected to an anode 310 of the light emitting diode 300. A cathode 320 of the light emitting diode 300 may be connected to a reference voltage $V_{SS}$. The reference voltage $V_{SS}$ is a voltage lower than the power voltage $V_{DD}$, and may provide a ground by using a ground voltage or the like.

The subpixel SP may operate as follows. First, when the scan signal is applied to the gate line GL and the switching transistor 200' is turned on, the data voltage $V_{DATA}$ applied to the data line DL may be transmitted to one end of the capacitor 201 and a gate electrode 220 of the driving transistor 200.

A voltage corresponding to the gate-source voltage $V_{GS}$ of the driving transistor 200 may be maintained for a predetermined time by the capacitor 201. The driving transistor 200 may cause the light emitting diode 300 to emit light by applying a driving current $I_{GS}$ corresponding to the gate-source voltage $V_{GS}$ to the anode 310 of the light emitting diode 300.

At this time, when a high data voltage $V_{DATA}$ is transmitted to the gate electrode of the driving transistor 200, the gate-source voltage $V_{GS}$ of the driving transistor 200 is lowered and a small amount of driving current $I_{GS}$ is applied to the anode 310 of the light emitting diode 300, so that the light emitting diode 300 displays a low gray scale. On the other hand, when a low data voltage $V_{DATA}$ is transmitted to the gate electrode of the driving transistor 200, the gate-source voltage $V_{GS}$ of the driving transistor 200 is increased and a large amount of driving current $I_{GS}$ is applied to the anode 310 of the light emitting diode 300, so that the light emitting diode 300 displays a high gray scale.

Referring to FIG. 4, a cross section of the backplane 100 to which the light emitting diode 300 is transferred is shown. The backplane 100 may also be referred to as the TFT substrate.

A buffer layer 103 may be formed on a substrate 101, and the driving transistor 200 may be disposed on the buffer layer 103. An upper portion of the substrate 101 may refer to the positive Y direction.

The substrate 101 may be composed of various materials. For example, the substrate 101 may be formed of a transparent glass containing SiO2 as a main component, may be formed of a transparent plastic to have flexibility, or may be formed of a metal.

The plastic of the substrate 101 may be an organic material selected from a group including polyethersulphone (PES), polyacrylate (PAR), polyetherimide (PEI), polyethylene naphthalate (PEN), polyethyleneterephthalate (PET), polyphenylene sulfide (PPS), polyallylate, polyimide, polycarbonate (PC), cellulose triacetate (TAC), cellulose acetate propionate (CAP), which are insulating organic materials.

The metal of the substrate 101 may be selected from the group including iron, chromium, manganese, nickel, titanium, molybdenum, stainless steel (SUS), Invar alloy, Inconel alloy, and Kovar alloy.

The buffer layer 103 may provide a flat surface on the upper portion of the substrate 101 and may block contamination or moisture from penetrating through the substrate 101. The buffer layer 103 may contain inorganic materials such as silicon oxide, silicon nitride, silicon oxynitride, aluminum oxide, aluminum nitride, titanium oxide or titanium nitride, or organic materials such as polyimide, polyester, and acrylic, and may be formed of a plurality of laminates among the exemplified materials.

The driving transistor 200 disposed on the buffer layer 103 may include an active layer 210, the gate electrode 220, the drain electrode 230, and the source electrode 240. The active layer 210 may be made of a semiconductor material, and may include a source region 210a, a drain region 210b, and a channel region 210c between the source region 210a and the drain region 210b.

The gate electrode 220 may be disposed on a portion of the active layer 210 corresponding to the channel region 210c. The source electrode 240 and the drain electrode 230 may be electrically connected to the source region 210a and the drain region 210b of the active layer 210, respectively. Although an embodiment where the gate electrode 220 of the driving transistor 200 is implemented as a top gate type disposed on the active layer 210 is shown, it is also possible that the gate electrode 220 is disposed below the active layer 210.

A first insulation layer 111 made of an inorganic insulating material may be disposed between the active layer 210 and the gate electrode 220, and a second insulation layer 112 may be disposed on the gate electrode 220. The first insulation layer 111 may be a gate insulation layer, and the second insulation layer 112 may be an interlayer insulation layer. On the other hand, one component being disposed on another component may include a structure in which all of one component is located on top of another component, as well as a structure in which one component surrounds or covers all or part of another component. In addition, one component covering another component may include not only a structure in which one component covers all of another components, but also a case where a hole is formed in one component so that a part of another component is exposed through the hole.

That is, the gate insulation layer 111 may be formed on the buffer layer 103 on which the active layer 210 is disposed to cover the active layer 210, and the interlayer insulation layer 112 may be formed on the gate insulation layer 112 on which the gate electrode 220 is disposed to cover the gate electrode 220.

The source electrode 240 and the drain electrode 230 may be disposed on the interlayer insulation layer 112. Holes through which the source electrode 240 and the drain electrode 230 pass may be formed in the interlayer insulation layer 112 and the gate insulation layer 111. The source electrode 240 and the drain electrode 230 may be electrically connected to the source region 210a and the drain region 210b of the active layer 210 through holes, respectively.

"Electrically connected" may include direct soldering of electrically conductive materials, connecting through separate wiring, and/or arranging a layer through which a current flows such as an anisotropic conductive film (ACF). Any method may be applied as long as the current flows between the two connected components. In addition, the 'connecting' certain components may include electrically connecting them.

A third insulation layer 113 may be disposed on the interlayer insulation layer 112. The third insulation layer 113 may be a planarization layer. The planarization layer 113 may be disposed on the interlayer insulation layer 112 to cover the source electrode 240, the drain electrode 230, and the interlayer insulation layer 112.

An anode pad 410 connected to the anode 310 of the light emitting diode 300 and a cathode pad 420 connected to the cathode 320 of the light emitting diode 300 may be disposed on the planarization layer 113. The anode pad 410 and the cathode pad 420 are made of the conductive material such as the metal, and are exposed from an upper insulation layer 114 to be electrically connected to other electrodes. In order to distinguish the electrode of the light emitting diode 300 from the electrode of the backplane 100, the term 'pad' is used only for the electrode pad of the backplane 100, and the terms the anode and the cathode are used for the electrode of the light emitting diode 300.

A hole for connecting the drain electrode 230 and the anode pad 410 may be formed in the third insulation layer 113. The anode pad 410 may be electrically connected to the drain electrode 230 through the hole. The source electrode 240 may be connected to the power line VL to which the power voltage $V_{DD}$ is supplied, and the gate electrode 220 may be connected to the data line DL to which the data voltage $V_{DATA}$ is supplied. The cathode pad 420 may be connected to the reference voltage Vss and may provide the ground to the light emitting diode 300 connected to the cathode pad 420.

A fourth insulation layer 114 may be disposed on the third insulation layer 113 on which the anode pad 410 and the cathode pad 420 are disposed. The fourth insulation layer 114 may be referred to as the upper insulation layer 114. The upper insulation layer 114 may cover the third insulation layer 113, the anode pad 410 and the cathode pad 420.

The above-described insulation layers may be formed of the organic insulating material or the inorganic insulating material. In addition, the above-described insulation layers may be formed by alternating the organic insulating material and the inorganic insulating material.

Referring to FIG. 4, connection holes 114H may be formed in the upper insulation layer 114 covering the anode pad 410 and the upper insulation layer 114 covering the cathode pad 420, respectively. The anode pad 410 and the cathode pad 420 may be exposed through the connection holes 114H formed in the upper insulation layer 114, and the anode 310 and the cathode 320 of the light emitting diode 300 may be electrically connected to the anode pad 410 and the cathode pad 420, respectively, through the connection holes 114H.

The structure from the substrate 101 to the upper insulation layer 114 may be defined as the backplane 100. The display module 10 and/or the display apparatus 1 may be manufactured by transferring the light emitting diode 300 onto the backplane 100.

Referring to FIG. 4, the light emitting diode 300 may include a p-n diode, the anode 310, and the cathode 320. The anode 310 and the cathode 320 may be formed of various conductive materials such as the metal, conductive oxide, and conductive polymer. The anode 310 may be electrically connected to the anode pad 410 of the backplane 100, and the cathode 320 may be electrically connected to the cathode pad 420 of the backplane 100.

The p-n diode may include a p-doped portion 330 on the anode 310 side and an n-doped portion 370 on the cathode 320 side, and a quantum well between the p-doped portion 330 and the n-doped portion 370. Conversely, the light emitting diode in which the doped portion on the cathode 320 side is the p-doped portion and the doped portion on the anode 310 side is the n-doped portion may be used.

The display apparatus 1, according to an embodiment, may be a top emission type display apparatus in which light is emitted in a direction opposite to the substrate 101. Therefore, when the driving current is applied to the anode 310 of the light emitting diode 300 through the anode pad 410 and the current flows from the anode 310 to the cathode 320, light is emitted in the opposite direction of the substrate 101, that is, the positive Y direction. The light emitting diode 300 provided as described above may be defined as a flip-chip LED.

the above described electrical connection between the electrodes may be made by various bonding methods. For example, the bonding method using the ACF may be applied. The bonding method for forming the flip-chip LED may be defined as a flip-chip bonding method.

Figure 5:
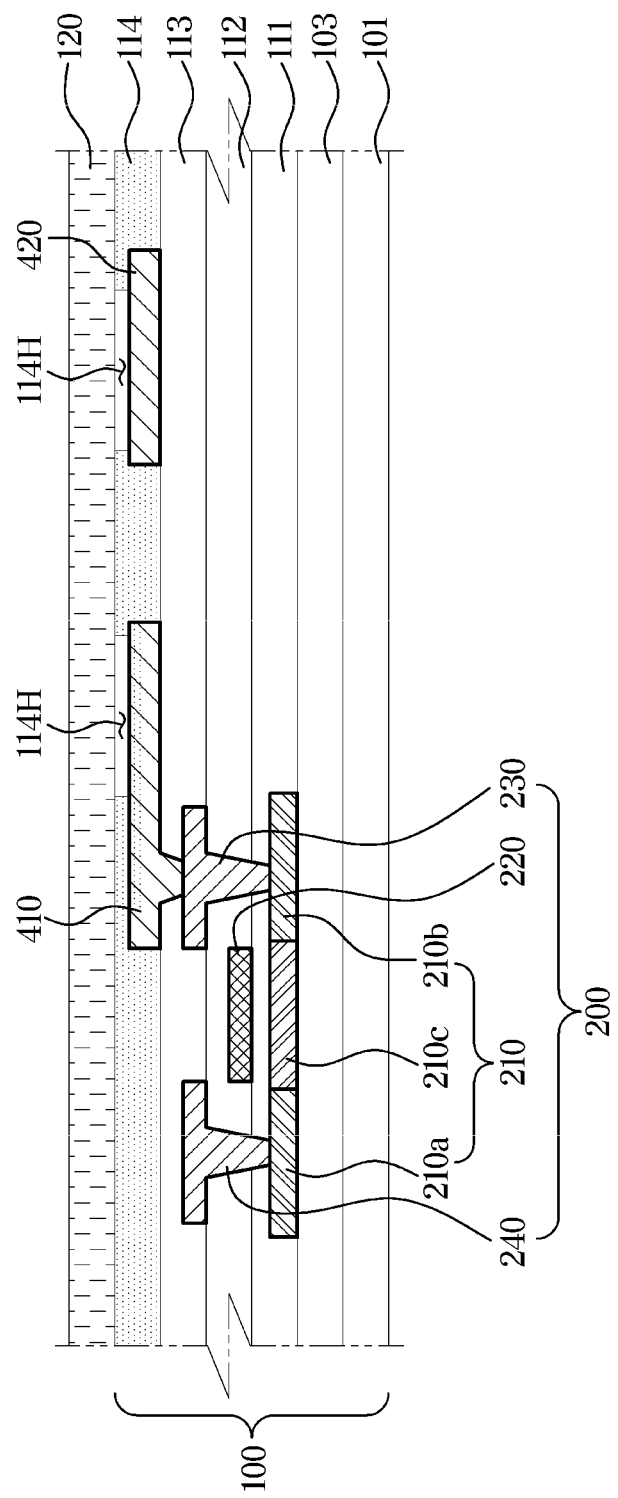
FIG. 5 is a cross-sectional view illustrating an anisotropic conductive film connected to a backplane according to an embodiment.

FIG. 5 shows an AFC connected to a backplane.

Referring to FIG. 5, an ACF 120 may be disposed on the upper insulation layer 114 in which the connection hole 114H is formed. The ACF 120 may uniformly disperse conductive particles in an insulating adhesive organic material, and may be provided in the form of a film. The ACF 120 may have conductivity in a thickness direction and insulation in a plane direction.

When heat is applied to the ACF 120 and the light emitting diode 300 is pressed onto the ACF 120, the current may flow in the thickness direction of the film to which the pressure is applied. Accordingly, the anode 310 of the light emitting diode 300 may be electrically connected to the anode pad 410, and the cathode 320 of the light emitting diode 300 may be electrically connected to the cathode pad 420.

As described above, the light emitting diode 300 may be implemented as the micro LED. A plurality of light emitting diodes 300 may be picked up on a wafer by a transfer mechanism and transferred to the backplane 100. The plurality of LEDs 300 may be transferred to the backplane 100 by compressing the plurality of LEDs 300 to the ACF 120.

However, the method in which the light emitting diode 300 is transferred to the backplane 100 is not limited to the above. In order to connect the light emitting diode 300 to the anode pad 410 and the cathode pad 420, a soldering method using a metal ink such as silver Ag, gold Au, or copper Cu may be used. In addition, a laser ablation method may be used in which the light emitting diode 300 is transferred to a target position of the backplane 100 by irradiating a laser.

Hereinafter, an entire process until the light emitting diode 300 is transferred to the backplane 100, that is, the manufacturing method of the display apparatus 1 will be described.

Figure 6:
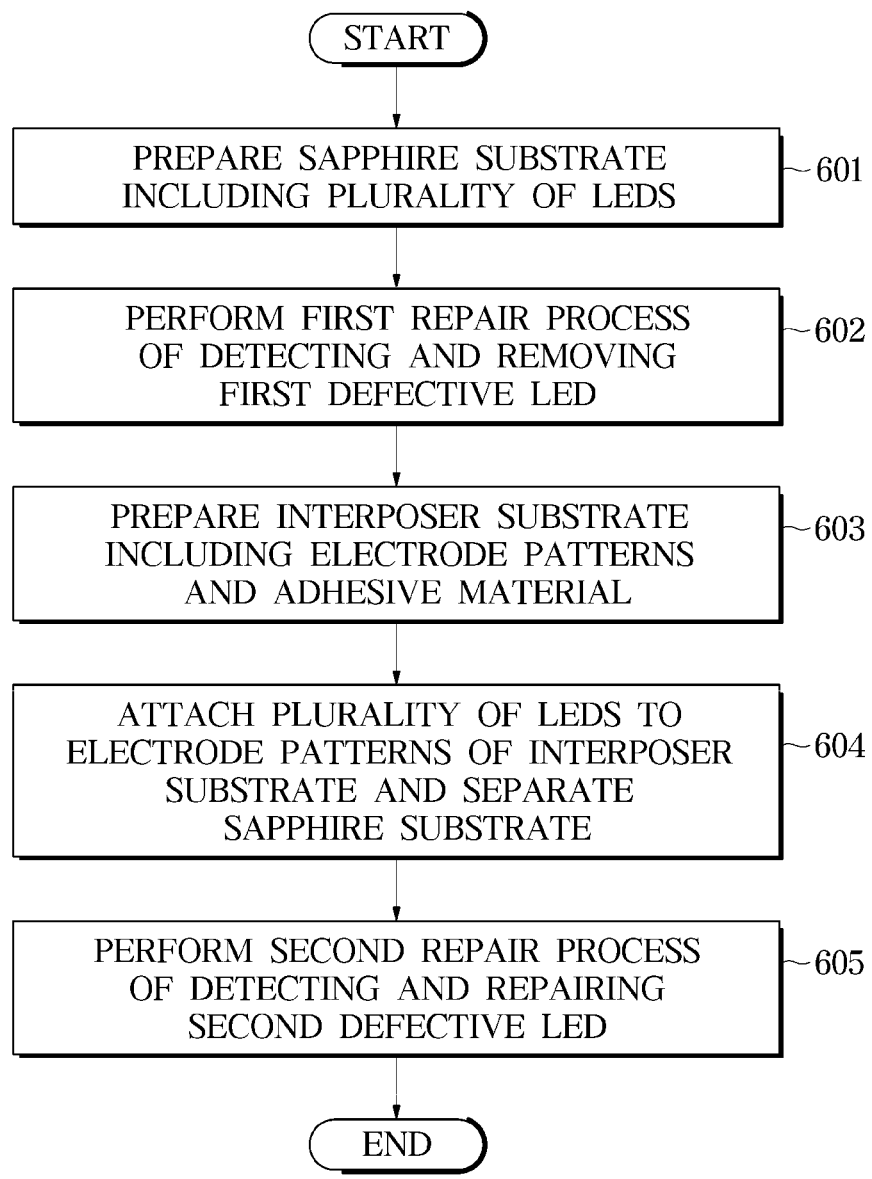
FIG. 6 is a flowchart of a manufacturing method of a display apparatus according to an embodiment.
Figure 7:
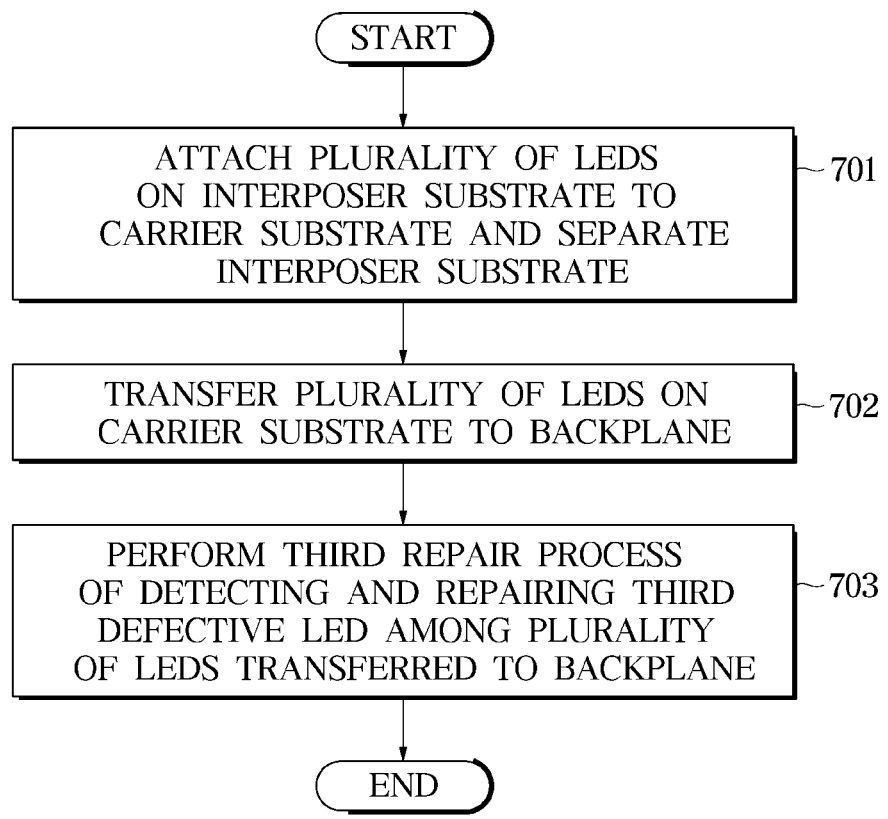
FIG. 7 is a flowchart of a manufacturing method of a display apparatus according to an embodiment.
Figure 8:
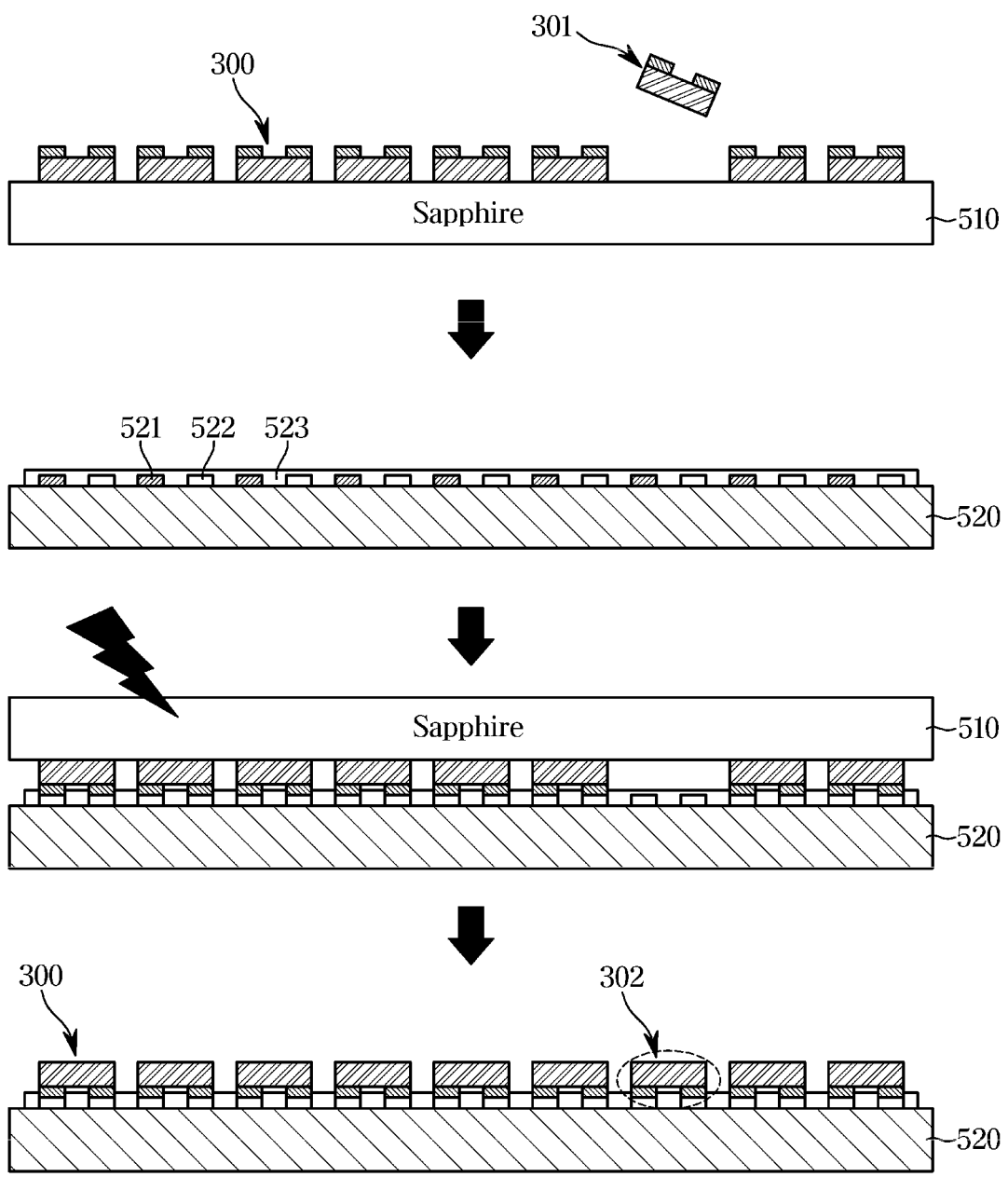
FIG. 8 is a diagram illustrating a first repair process in a manufacturing method of a display apparatus according to an embodiment.
Figure 9:
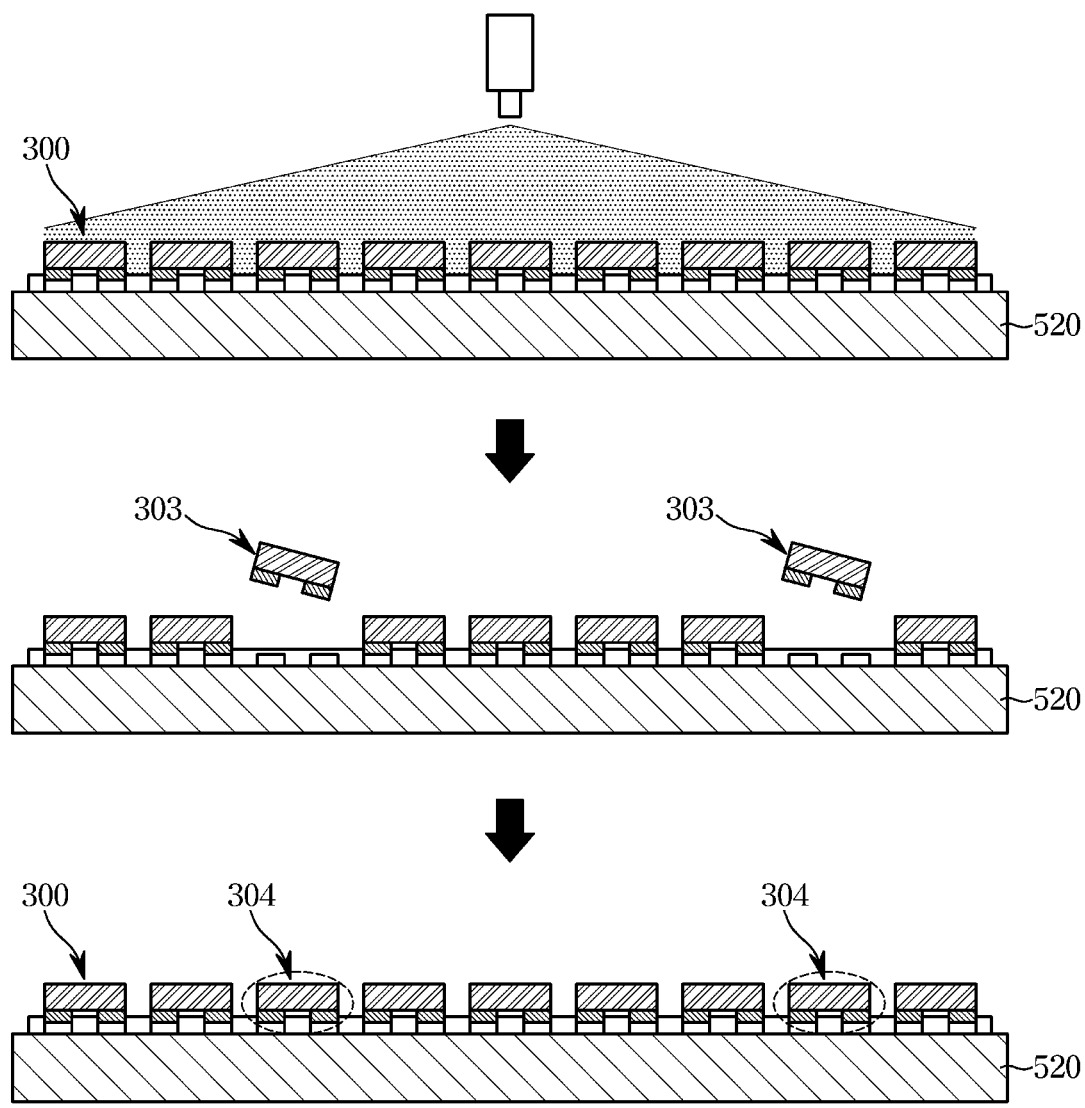
FIG. 9 is a diagram illustrating a second repair process in a manufacturing method of a display apparatus according to an embodiment.
Figure 10:
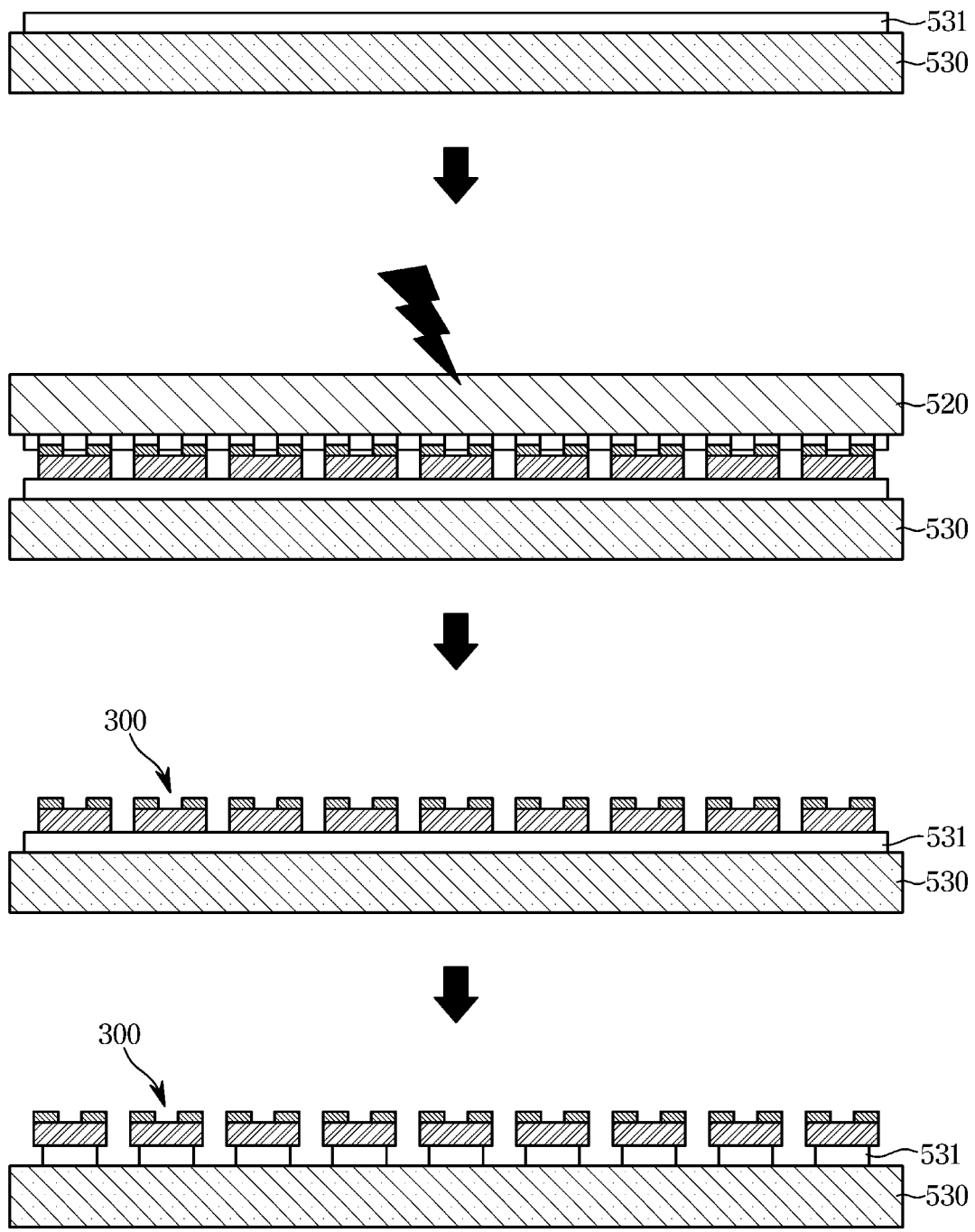
FIG. 10 is a diagram illustrating a process in which a light emitting diode is attached to a carrier substrate after a second repair process according to an embodiment.
Figure 11:
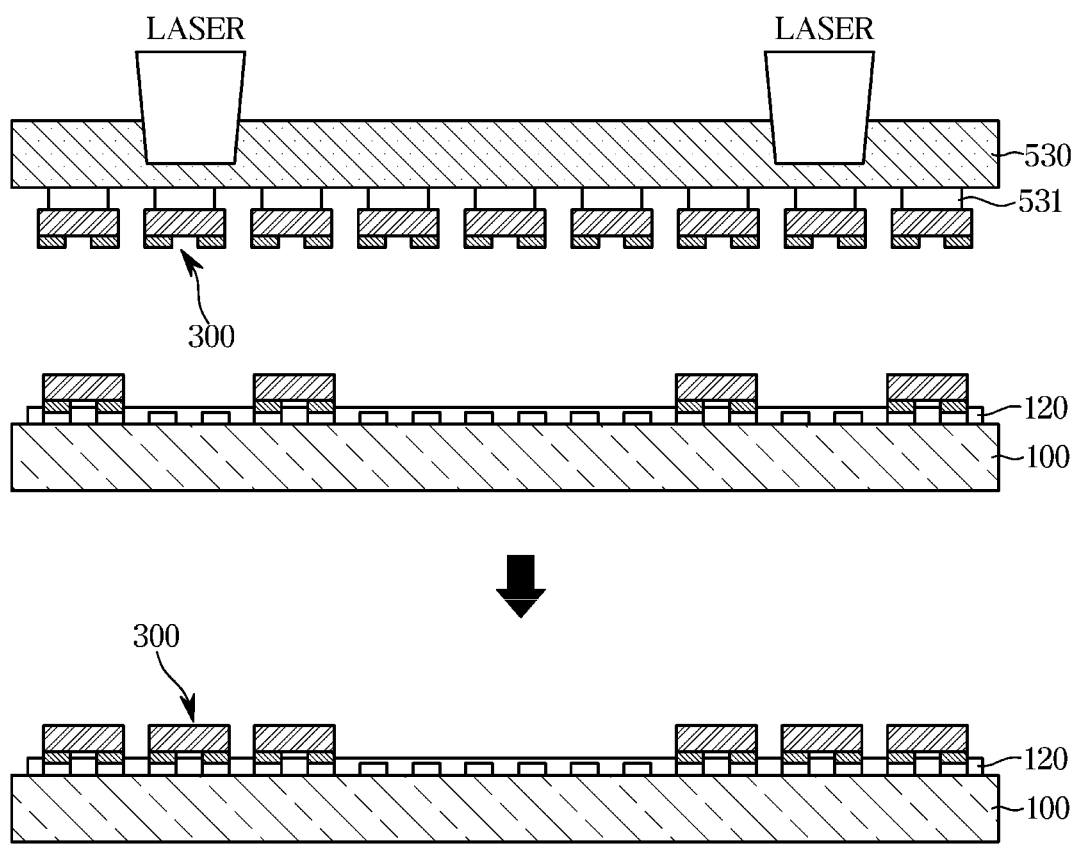
FIG. 11 is a diagram illustrating an example of a method in which a plurality of light emitting diodes are transferred to a backplane according to an embodiment.

FIGS. 6 and 7 are flowcharts of a manufacturing method of a display apparatus according to an embodiment, FIGS. 8 and 9 are diagrams showing a first repair process and a second repair process among manufacturing methods of a display apparatus according to an embodiment, FIG. 10 is a diagram showing a process in which a light emitting diode is attached to a carrier substrate after a second repair process, and FIG. 11 is a diagram showing an example of a method in which a plurality of light emitting diodes are transferred to a backplane.

The manufacturing method of the display apparatus 1 may be implemented by a manufacturing apparatus.

Referring to FIGS. 6 and 8, a sapphire substrate 510 including the plurality of light emitting diodes 300 is prepared (operation 601). The light emitting diode 300 may be formed on one surface of the sapphire substrate 510 of the wafer. The wafer on which the light emitting diode 300 is formed is prepared by a separate process. Since the process of forming the light emitting diode 300 on the sapphire substrate 510 is known, a detailed description will be omitted.

Subsequently, a first repair process of detecting and removing a first defective LED 301 among the plurality of LEDs provided on the sapphire substrate 510 may be performed (operation 602). A defective light emitting diode may exist among the plurality of light emitting diodes 300 provided on the wafer. Therefore, an inspection process for detecting the defective light emitting diode on the sapphire substrate 510 is required. The first defective light emitting diode 301 detected in the first repair process may be removed by being picked up by a stamp or the like.

The first repair process may include detecting the first defective LED 301 by performing a photoluminescence (PL) inspection. The PL inspection may be a test method that irradiates light with a specific energy to the plurality of light emitting diodes, captures the emission of energy absorbed by the light emitting diodes as light, and detects defective LEDs by image processing and analysis of the captured light.

Next, an interposer substrate 520 including electrode patterns 521 and 522 and an adhesive material 523 may be provided (operation 603). The electrode patterns 521 and 522 of the interposer substrate 520 may be electrodes for supplying power to the plurality of light emitting diodes 300. The electrode patterns 521 and 522 may transmit power supplied from the outside to the plurality of light emitting diodes 300 to cause the plurality of light emitting diodes 300 emit light. The adhesive material 523 may serve to attach the plurality of light emitting diodes 300 to the electrode patterns 521 and 522.

When the interposer substrate 520 is provided, the plurality of light emitting diodes 300 may be attached to the electrode patterns 521 and 522 of the interposer substrate 520, and the sapphire substrate 510 may be separated (operation 604). When attaching the plurality of light emitting diodes 300 to the electrode patterns 521 and 522 of the interposer substrate 520, the anode 310 of each of the plurality of light emitting diodes 300 may be connected to the first electrode 521 of the electrode patterns 521 and 522, and the cathode 320 of each of the plurality of light emitting diodes 300 may be connected to the second electrode 522 of the electrode patterns 521 and 522.

The sapphire substrate 510 may be removed through a laser lift off (LLO) process. Separating the sapphire substrate 510 through the LLO process is known, and a detailed description thereof will be omitted.

After the first defective LED 301 is removed in the first repair process, a first repair LED 302 may be attached to the electrode patterns 521 and 522 of the interposer substrate 520. The first repair LED 302 may be attached to a position of the interposer substrate 520 corresponding to a position of the first defective LED 301 in the sapphire substrate 510. That is, an empty space on the interposer substrate 520 from removal of the first defective LED 301 may be filled with the first repair LED 302.

Next, referring to FIGS. 6 and 9, a second repair process of detecting and repairing a second defective LED 303 among the plurality of light emitting diodes 300 on the interposer substrate 520 may be performed (605). The second defective LED 303 may refer to the defective LED that has not been found in the first repair process.

In the second repair process, an electroluminescence (EL) inspection may be performed on the interposer substrate 520. The second repair process may include replacing the second defective LED 303 with a second repair LED 304 when the second defective LED 303 is detected by performing the EL inspection. The second defective LED 303 detected in the second repair process may be simply removed by being picked up by a stamp or the like. The second repair LED 304 may be attached to the position where the second defective LED 303 was removed.

The EL inspection may be a test method for detecting the defective LED by supplying power to the plurality of LEDs 300 and capturing and/or measuring light emitted from the plurality of LEDs 300. The EL inspection may detect defect more accurately than the PL inspection. That is, defect not detected through the PL inspection may be detected by the EL inspection.

As described above, by performing the process of repairing the defective LED before transferring the plurality of LEDs 300 to the backplane 100, the defective rate of the display apparatus 1 may be reduced. In particular, since the second repair process can light the plurality of LEDs without a complicated wiring structure, it is possible to repair the defect of the LEDs much more easily than the process of repairing the defect by lighting the LEDs at the backplane 100. In addition, since the second repair process performs the EL inspection, it is possible to more accurately detect the defective LED.

Next, referring to FIGS. 7 and 10, the plurality of LEDs 300 on the interposer substrate 520 may be attached to a carrier substrate 530 and the interposer substrate 520 may be separated (operation 701). In order to transfer the light emitting diode 300 to the backplane 100, the interposer substrate 520 must be removed. In other words, the anode 310 and the cathode 320 of the light emitting diode 300 must be separated from the interposer substrate 520. Accordingly, a process of attaching the plurality of LEDs 300 of the interposer substrate 520 to the carrier substrate 530 may be performed. To this end, an adhesive layer 531 may be provided on the carrier substrate 530. The adhesive layer 531 may serve to attach the plurality of LEDs 300 to the carrier substrate 530. In this case, a light emitting surface of the light emitting diode 300 may be attached to the carrier substrate 530. The LLO process may also be used to separate the interposer substrate 520. When the interposer substrate 520 is separated, the electrode patterns 521 and 522 and the adhesive material 523 may also be removed.

The adhesive layer 531 may include a variety of materials. For example, the adhesive layer 531 may be selectively provided from acrylic, polymethyl methacrylate (PMMA), methyl methacrylate (MMA), methacrylic acid (MAA), butyl methacrylate. crylate (BMA), polycarbonate (PC), polyurethane (PU), epoxy, polyvinylchloride (PVC), photocurable resin composition, thermosetting resin composition, naturally curable resin composition, transparent resin composition, and a conductive paste. A type of the adhesive layer 531 is not limited to the above.

When the plurality of LEDs 300 are attached to the carrier substrate 530 by the adhesive layer 531, the adhesive layer 531 that does not contact the light emitting surface of the plurality of LEDs 300 may be removed. Removal of the adhesive layer 531 may be performed by various methods. For example, the adhesive layer 531 may be partially removed by etching or laser irradiation.

Subsequently, referring to FIG. 11, a plurality of LEDs 300 on the carrier substrate 530 may be transferred to the backplane 100 (operation 702). As described above, there are various methods of transferring the light emitting diode 300, but the embodiment illustrated in FIG. 11 may use a laser ablation method in which one or more light emitting diodes 300 are transferred to a target position of the backplane 100 by irradiating with laser. In addition, the plurality of LEDs 300 may be electrically connected to the backplane 100 by the ACF 120 provided on the backplane 100.

Subsequently, a third repair process of detecting and repairing a third defective LED among the plurality of LEDs 300 transferred to the backplane 100 may be performed (operation 703). The third defective LED may refer to a defective LED that is not found in the second repair process. The third repair process may include performing the EL inspection and mounting the third repair light emitting diode corresponding to the third defective LED in a repair area of the backplane 100. The third repair process will be described in detail in FIGS. 15 to 20 below.

The above-described repair processes may be performed by various manufacturing apparatuses and/or manufacturing systems that execute the manufacturing methods of display apparatuses. Various manufacturing apparatuses and/or manufacturing systems may include inspection apparatuses for detecting the defective LEDs.

Figure 12:
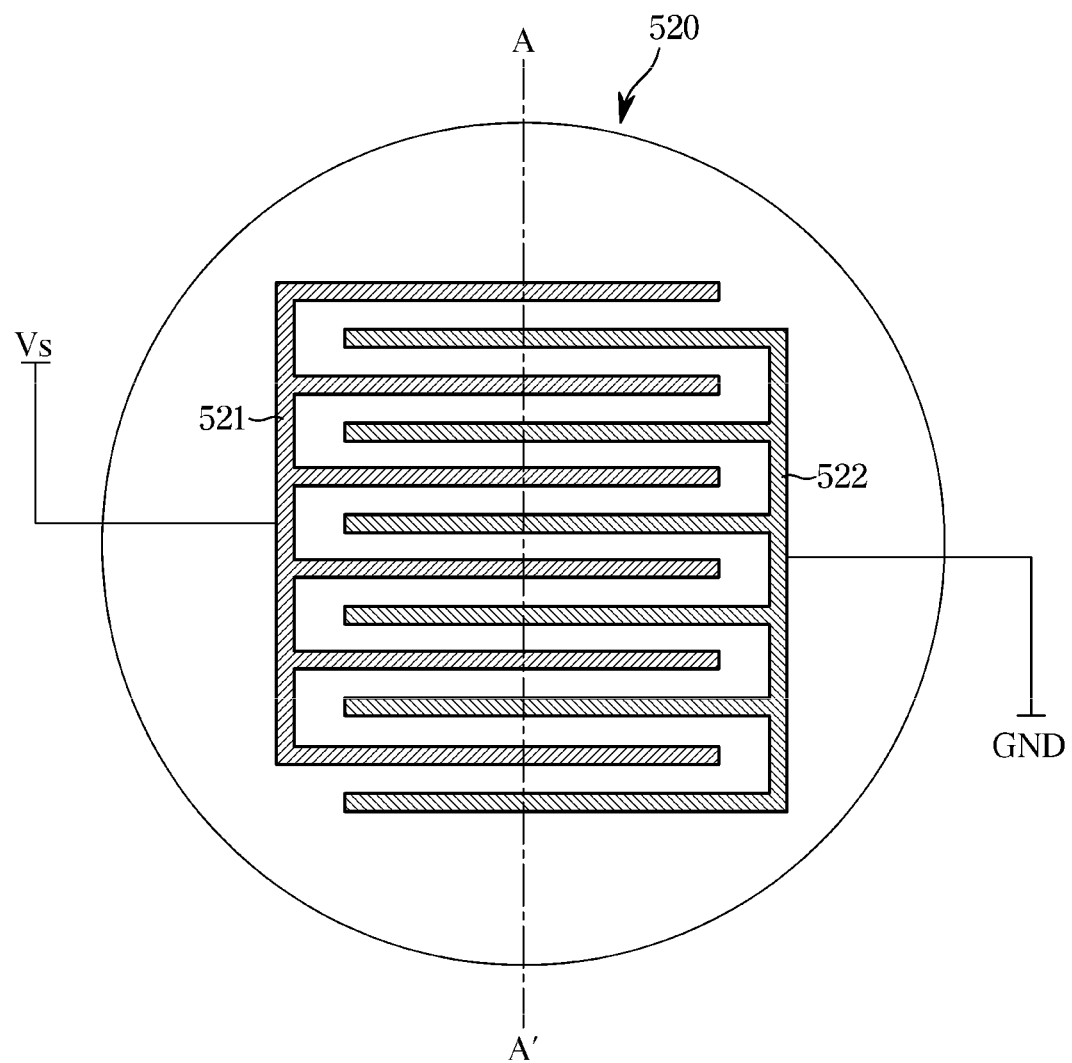
FIG. 12 is a plan view of an interposer substrate according to an embodiment.

FIG. 12 is a plan view of an interposer substrate according to an embodiment.

Referring to FIG. 12, the electrode patterns 521 and 522 may be disposed on the interposer substrate 520. The electrode patterns 521 and 522 may include the first electrode 521 connected to the anode 310 of the light emitting diode 300 and the second electrode 522 connected to the cathode 320 of the light emitting diode 300. Conversely, the first electrode 521 may be connected to the cathode 320, and the second electrode 522 may be connected to the anode 310.

The electrode patterns 521 and 522 may be provided in various shapes. In FIG. 12, the first electrode 521 and the second electrode 522 may be formed in a fine-toothed comb shape or a ring shape with one side open, respectively, and may be arranged to cross each other, but are not limited thereto. For example, the electrode patterns 521 and 522 may be formed in a mesh shape or an annular shape.

When the plurality of LEDs 300 are attached to the electrode patterns 521 and 522, the current may flow through the first electrode 521, the light emitting diode 300, and the second electrode 522. That is, the first electrode 521 may correspond to a positive electrode, and the second electrode 522 may correspond to a negative electrode. The first electrode 521 may receive a test voltage Vs, and the second electrode 522 may provide a ground GND. Accordingly, when the electrode patterns 521 and 522 are connected to an external power source, the current may flow through the plurality of LEDs 300 causing the plurality of LEDs 300 to emit light. The external power source may be the manufacturing apparatus that executes a manufacturing method of the display apparatus 1 according to the embodiment.

The interposer substrate 520 may include various materials. For example, the interposer substrate 520 may include transparent glass, transparent plastic to have flexibility, a silicon substrate, or the metal.

FIG. 13 is a cross-sectional view of an interposer substrate according to an embodiment.

Figure 13A:
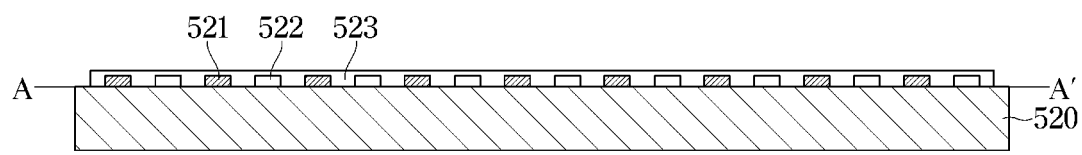
FIG. 13A is a cross-sectional view of an interposer substrate according to an embodiment.
Figure 13B:
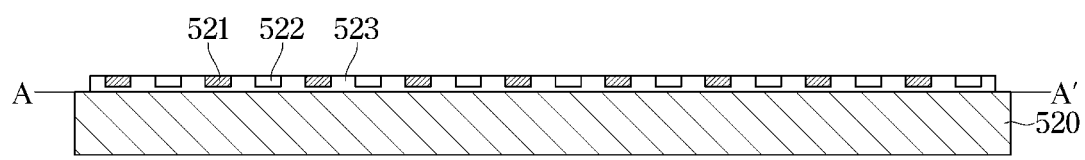
FIG. 13B is a cross-sectional view of an interposer substrate according to another embodiment.

FIGS. 13A and 13B shown different embodiments of the interposer substrate 520 that may be manufactured through different processes. As shown in FIG. 13A, the adhesive material 523 may be applied on the electrode patterns 521 and 522. That is, after the electrode patterns 521 and 522 are formed on the interposer substrate 520, the adhesive material 523 may be applied. In FIG. 13A, the adhesive material 523 is shown as covering all of the electrode patterns 521 and 522, but some of the electrode patterns 521 and 522 may be exposed from the adhesive material 523. For example, the adhesive material 523 may not be applied to the upper surfaces of the electrode patterns 521 and 522.

Alternatively, as illustrated in FIG. 13B, the electrode patterns 521 and 522 may be disposed on the adhesive material 523. That is, after the adhesive material 523 is first applied on the interposer substrate 520, the electrode patterns 521 and 522 may be disposed thereon.

The adhesive material 523 may provide an adhesive force so that the plurality of LEDs 300 are attached to the electrode patterns 521 and 522. The adhesive material 523 may include a variety of materials. For example, the adhesive material 523 may include acrylic, polymethyl methacrylate (PMMA), methyl methacrylate (MMA), methacrylic acid (MAA), butyl methacrylate. crylate (BMA), polycarbonate (PC), polyurethane (PU), epoxy, polyvinylchloride (PVC), photocurable resin composition, thermosetting resin composition, naturally curable resin composition, transparent resin composition, and the conductive paste.

Figure 14:
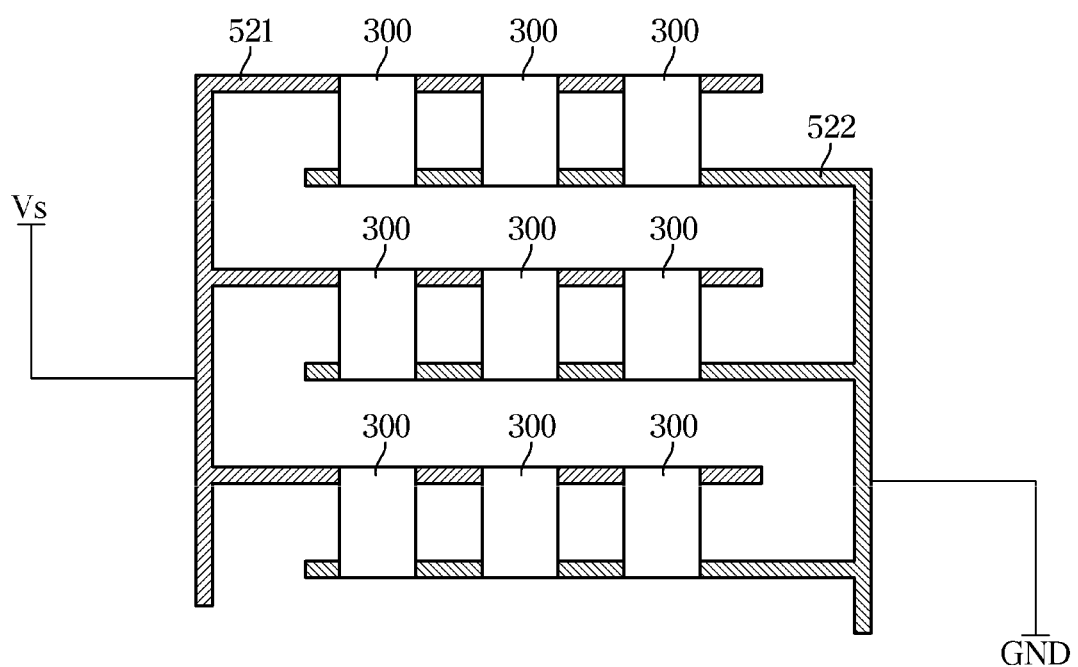
FIG. 14 is a diagram illustrating a light emitting diode attached to an electrode pad of an interposer substrate according to an embodiment.

FIG. 14 is a diagram showing light emitting diodes attached to an electrode pad of an interposer substrate according to an embodiment.

Referring to FIG. 14, the plurality of LEDs 300 may be electrically connected to the first electrode 521 and the second electrode 522 disposed on the interposer substrate 520. That is, the anode 310 of the light emitting diode 300 may be connected to the first electrode 521, and the cathode 320 of the light emitting diode 300 may be connected to the second electrode 522. Alternatively, the first electrode 521 may be connected to the cathode 320, and the second electrode 522 may be connected to the anode 310.

When the plurality of LEDs 300 are attached to the electrode patterns 521 and 522, the current may flow through the first electrode 521, the light emitting diode 300, and the second electrode 522. Accordingly, the plurality of LEDs 300 may emit light. A defect of the light emitting diode 300 may be detected by measuring the light emitted by the plurality of LEDs 300.

In an embodiment of the manufacturing method of the display apparatus 1, as the above-described interposer substrate 520 is provided, the defect inspection for the plurality of LEDs 300 may be easily performed. That is, since the interposer substrate 520 is provided, the EL inspection may be performed before transferring the light emitting diode 300 to the backplane 100 without the complicated wiring structure such as the TFT circuit.

Accordingly, the number of final repairs for repairing the light emitting diode 300 transferred to the backplane 100 may be minimized, and side effects resulting from the final repair may be reduced. In addition, the number and size of electrode pads provided on the backplane 100 for final repair may be reduced. Therefore, a pixel size of the display apparatus 1 may be reduced and high resolution may be realized.

Hereinafter, the third repair process will be described. In the third repair process, the third defective LED may be detected among the plurality of LEDs 300 transferred to the backplane 100, and a third repair LED corresponding to the third defective LED may be mounted in the repair area of the backplane 100. The third defective LED may be detected through the EL inspection. The structure of the electrode pad for mounting the third repair LED is described below.

Figure 15:
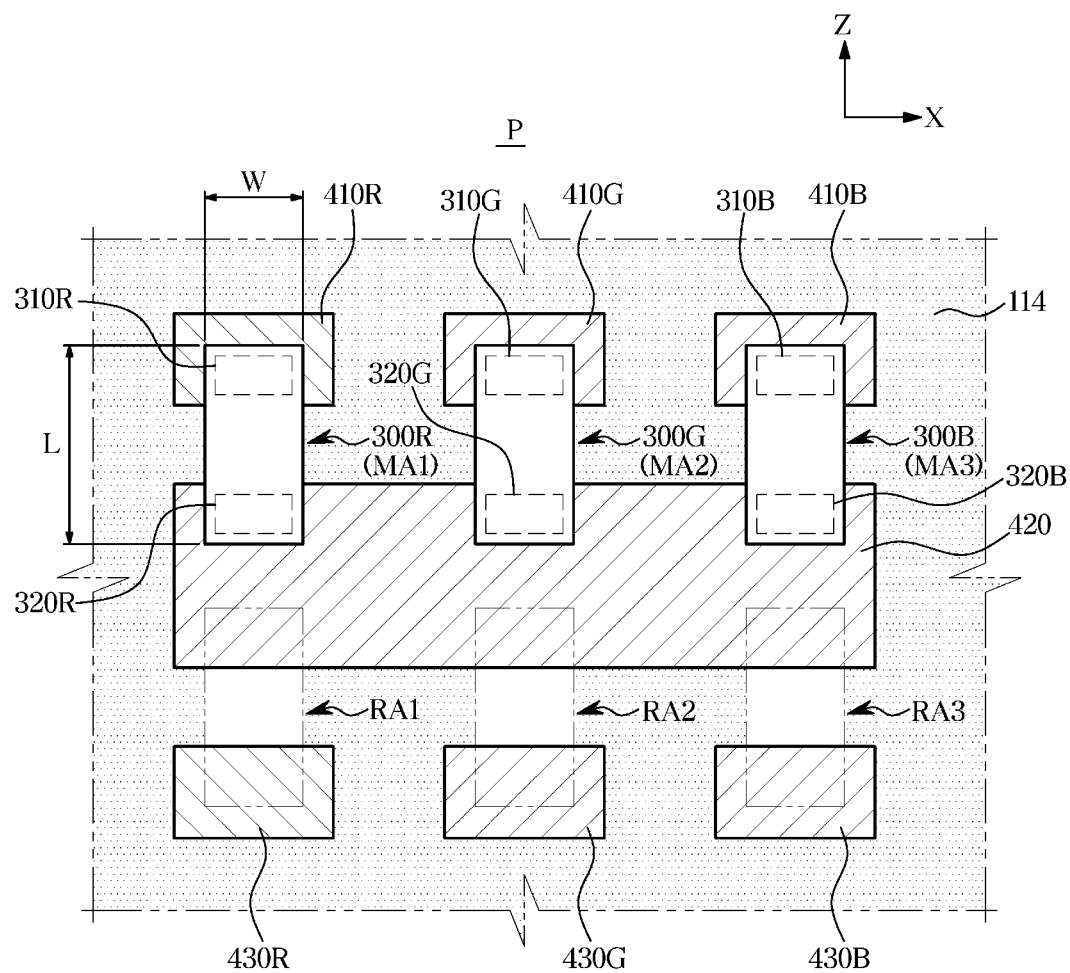
FIG. 15 is a plan view of a unit pixel according to an embodiment.
Figure 16:
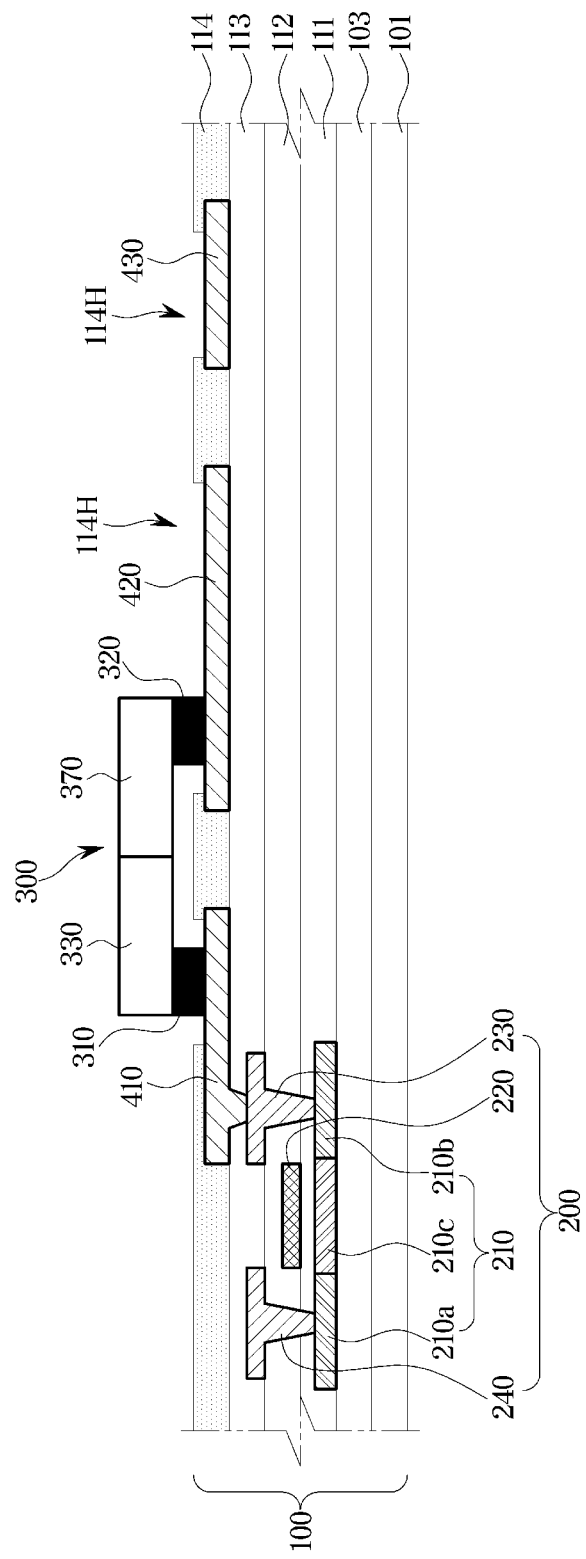
FIG. 16 is a cross-sectional view of a unit pixel according to an embodiment.

FIG. 15 is a plan view of a unit pixel according to an embodiment, and FIG. 16 is a cross-sectional view of a unit pixel according to an embodiment.

In FIGS. 15 and 16, the light emitting diode 300 may be implemented in a rectangular or similar shape having a width W and a length L. The width and length of the light emitting diode 300 are parameters that are perpendicular to each other, and a longer parameter of the two parameters may be defined as the length L and a shorter parameter may be defined as the width W. The anode 310 of the light emitting diode 300 may be provided at one end in the longitudinal direction, and the cathode 320 of the light emitting diode 300 may be provided at the other end in the longitudinal direction.

However, the shape of the light emitting diode 300 is not limited thereto, and as long as the width and length such as a hexagon, an octagon, or an ellipse may be defined, the light emitting diode 300 may be employed as a planar shape.

As described above, the unit pixel P according to an embodiment may include three subpixels SP(R), SP(G), and SP(B). The subpixels SP(R), SP(G), SP(B) may include main areas MA1, MA2, and MA3 where the LEDs 300 (300R, 300G, 300B) are disposed, respectively, and repair areas RA1, RA2, and RA3 in which the third repair LEDs 300' (300R', 300G', 300B') are disposed. In other words, the backplane 100 may include the main areas MA1, MA2, and MA3 in which the plurality of LEDs 300 are disposed, and the repair areas RA1, RA2, the RA3 in which the third repair LEDs can be mounted. The third repair LEDs 300' may be disposed in the repair areas RA1, RA2, and RA3 when the light emitting diode 300 fails to light.

As shown in FIG. 15, the red light emitting diode 300R, the green light emitting diode 300G, and the blue light emitting diode 300B may be disposed in the main areas MA1, MA2, and MA3, respectively. The plurality of LEDs 300R, 300G, and 300B may be arranged along the width W direction (X direction) of the light emitting diode 300. Likewise, the plurality of anode pads 410R, 410G, and 410B may be arranged along the width W direction (X direction) of the light emitting diode 300. The repair areas RA1, RA2, and RA3 may be provided in the length L direction (Z direction) of the main light emitting diode 300 with respect to the main areas MA1, MA2, and MA3.

Hereinafter, in order to distinguish it from the third repair LEDs 300' (300R', 300G', 300B'), the LEDs 300 disposed in the main areas MA1, MA2, and MA3 will be referred to as the main light emitting diode 300 and described.

Repair anode pads 430 (430R, 403G, 430B) for connection to the anode 310' of the third repair LED 300' may be provided on the backplane 100. The cathode pad 420 may be disposed between the anode pads 410 (410R, 410G, 410B) and the repair anode pad 430. The repair anode pads 430 (430R, 403G, 430B) may be arranged along the X direction. That is, the cathode pad 420 may be connected to the cathode 320 of the main light emitting diode 300 and the cathode 320' of the third repair LED 300' as a common ground electrode, and may provide the ground.

Referring to FIG. 16, the repair anode pad 430 may be disposed on the planarization layer 113 together with the anode pad 410 and the cathode pad 420. The upper insulation layer 114 may be disposed on the planarization layer 113, and the connection holes 114H may be formed in the upper insulation layer 114 located on the anode pad 410, the cathode pad 420, and the repair anode pad 430, respectively. The main light emitting diode 300 may be connected to the anode pad 410 and the cathode pad 420 by various bonding methods such as bonding using the ACF 120 and soldering bonding.

After performing a lighting test on the light emitting diode 300, if there is no defect in the light emitting diode 300, the display apparatus 1 may be completed without connecting the third repair LED 300'. However, when the defective LED (the third defective LED) is detected among the plurality of LEDs 300, the third repair LED corresponding to the defective LED may be mounted on the backplane 100.

Figure 17:
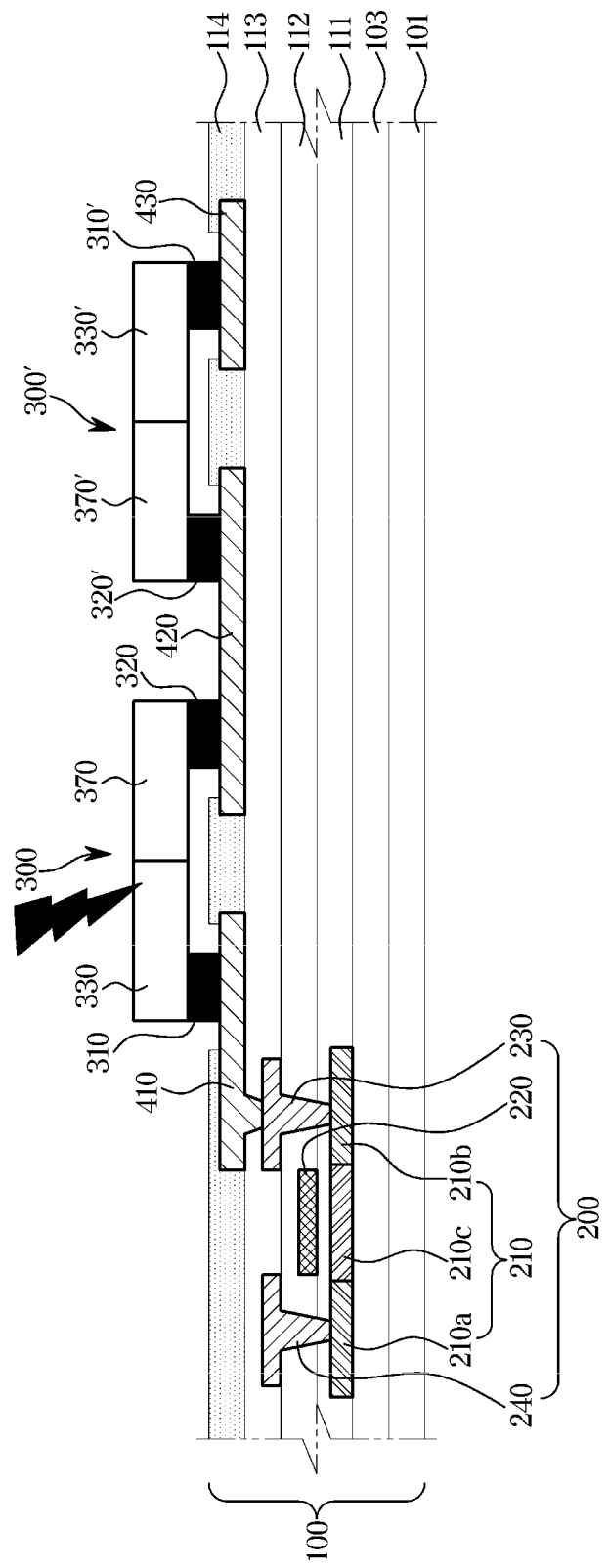
FIG. 17 is a cross-sectional view of a unit pixel on which a repair light emitting diode is disposed according to an embodiment.
Figure 18:
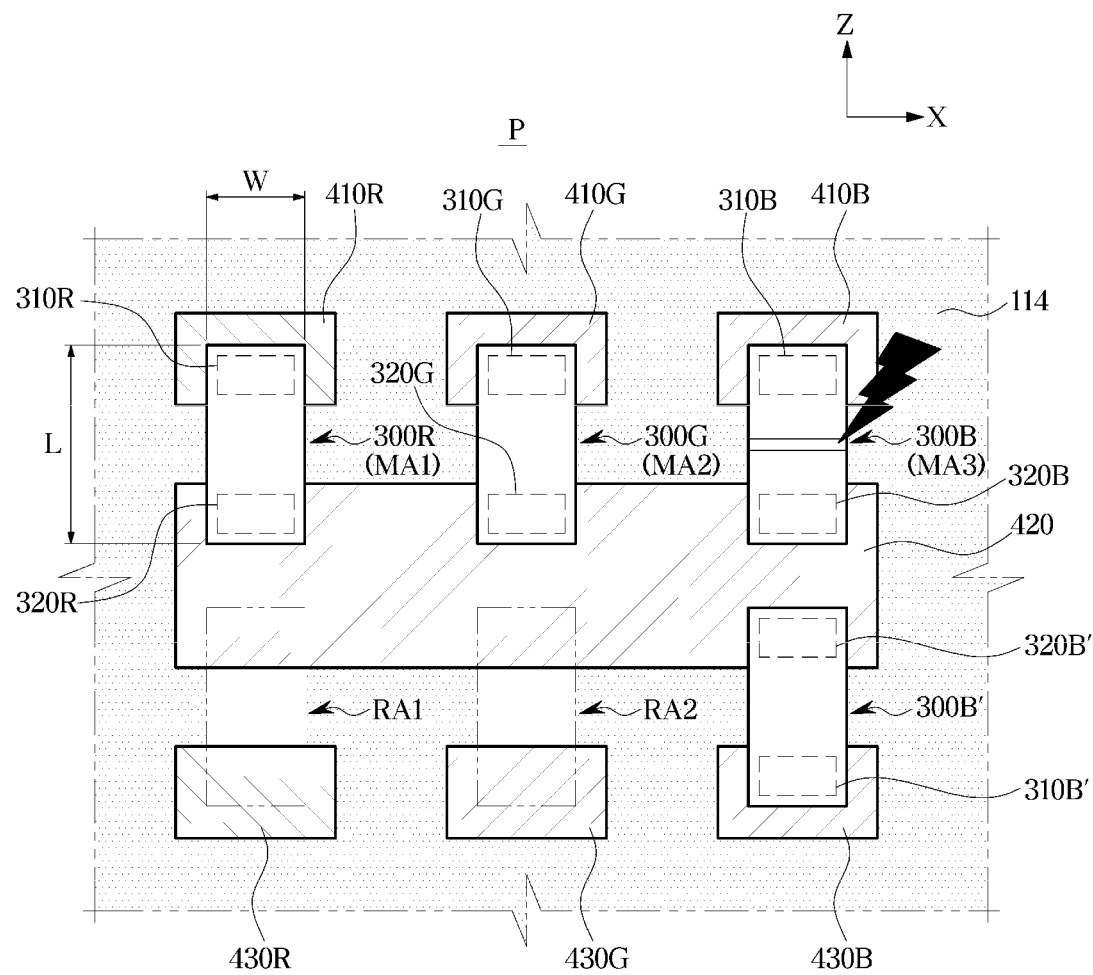
FIG. 18 is a cross-sectional view of a subpixel on which a repair light emitting diode is disposed according to an embodiment.
Figure 19:
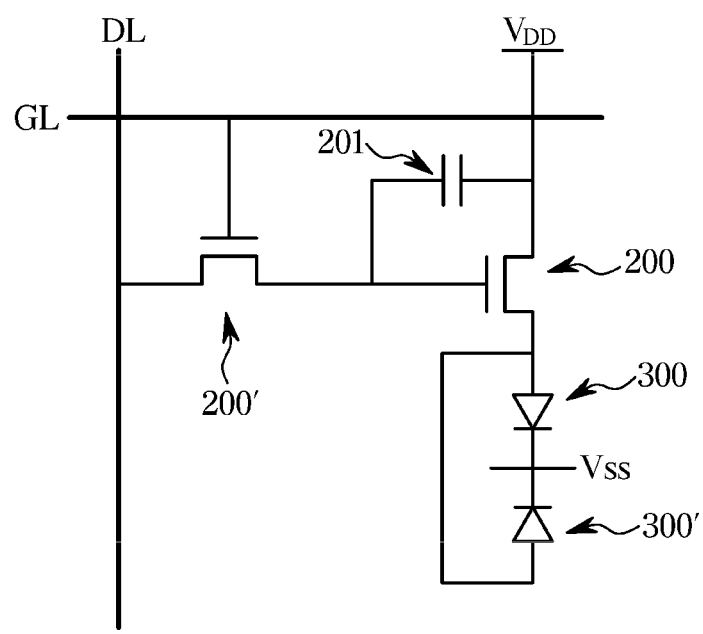
FIG. 19 is a circuit diagram of a subpixel on which a repair light emitting diode is disposed according to an embodiment.

FIG. 17 is a plan view of a unit pixel on which a repair light emitting diode is mounted according to an embodiment, FIG. 18 is a cross-sectional view of a subpixel on which a repair light emitting diode is mounted according to an embodiment, and FIG. 19 is a circuit diagram of a subpixel on which a repair light emitting diode is mounted according to an embodiment.

Referring to FIGS. 17 and 18, the defect may be detected in the blue light emitting diode 300B among the plurality of main light emitting diodes 300. That is, the blue light emitting diode 300B may correspond to the third defective LED. In this case, the third blue repair light emitting diode 300B' corresponding to the blue light emitting diode 300B may be mounted on the backplane 100. That is, the third repair LED 300' may have the same color as the third defective LED.

In addition, the blue light emitting diode 300B, which is the third defective LED, may be cut. The third defective LED 300B may be cut by laser irradiation. Alternatively, the wiring connected to the third defective LED 300B may be cut.

Referring to FIG. 18, the anode 310B' of the third repair LED 300B' may be electrically connected to the repair anode pad 430B, and the cathode 320B' of the third repair LED 300B' may be electrically connected to the cathode pad 420. That is, the main light emitting diode 300B and the third repair LED 300B' may share the cathode pad 420.

The circuit of the subpixel SP shown in FIG. 18 may be provided as shown in FIG. 19. Since the main light emitting diode 300 and the third repair LED 300' share the cathode pad 420, they may be connected to the same reference voltage Vss. In addition, the repair anode pad 430 and the anode pad 410 may receive the driving current from the same driving transistor 200.

Since the third repair process is performed after the plurality of LEDs 300 are transferred to the backplane 100, there is a risk of damage to wiring such as the TFT circuit provided on the backplane 100 when the defective LED is removed. When the wiring provided on the backplane 100 is damaged, it is difficult to repair. Therefore, in order to reduce this risk, the second repair process may be performed using the interposer substrate 520 described above. By using the interposer substrate 520, the defect detection and repair may be easily performed before the light emitting diode 300 is transferred to the backplane 100.

Also, by performing the second repair process, the number of times of the third repair process may be reduced. In addition, the number and size of electrode pads for mounting the third repair LED may be reduced. Therefore, the pixel size of the display apparatus 1 may be reduced and the high resolution may be realized.

Figure 20:
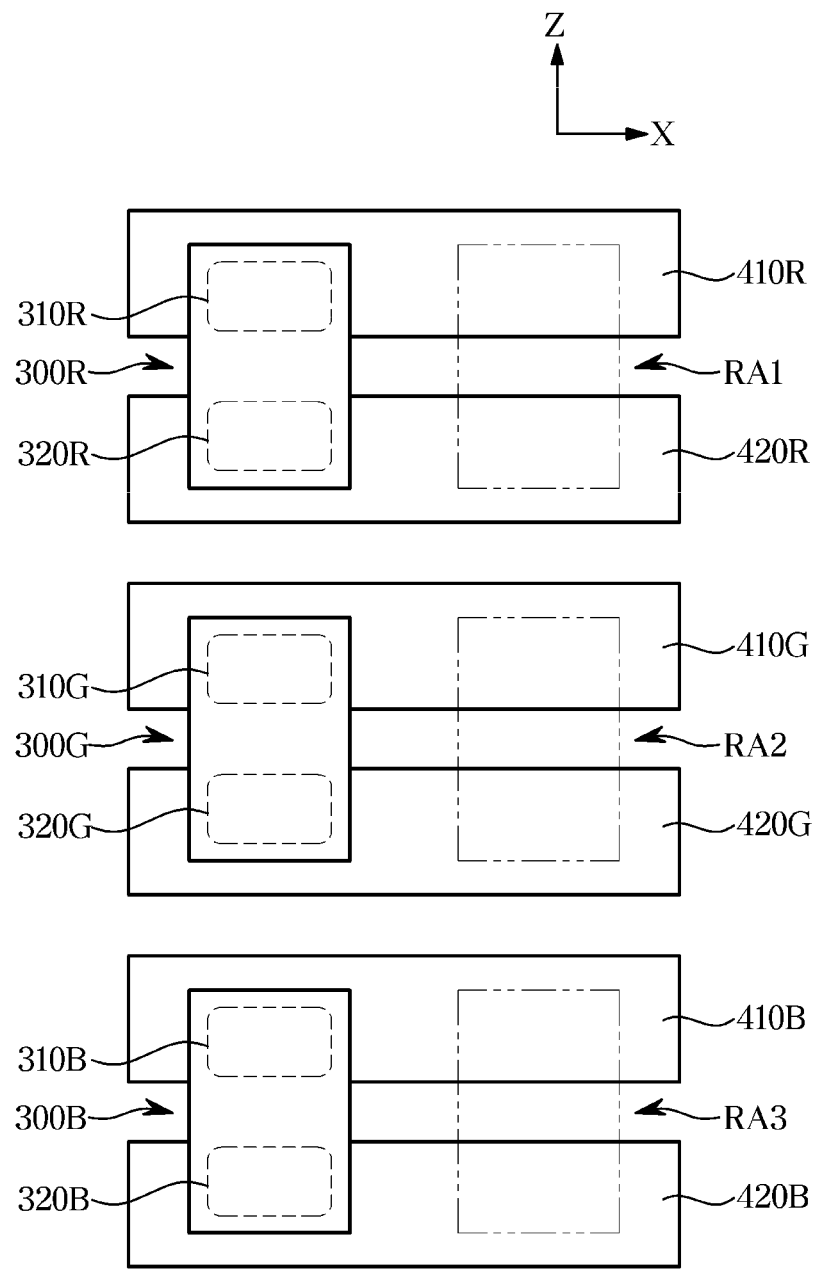
FIG. 20 is a plan view of a unit pixel according to another embodiment.

FIG. 20 is a plan view of a unit pixel according to another exemplary embodiment.

Referring to FIG. 20, a plurality of anode pads 410 (410R, 410G, 410B) and a plurality of cathode pads 420 (420R, 420G, 420B) may be formed in a structure different from those illustrated in FIGS. 15 and 17. The plurality of main light emitting diodes 300R, 300G, and 300B may be connected to separate cathode pads 420R, 420G, and 420B, respectively. Even when the cathode pad 420 is not shared, the plurality of LEDs 300R, 300G, and 300B may be connected to the common reference voltage Vss.

In addition, the anode pad 410 (410R, 410G, 410B) and the cathode pad 420 (420R, 420G, 420B) may be sized to include the repair areas RA1, RA2, and RA3, thus allowing mounting of the main LEDs 300R, 300G, and 300B and the third repair LED 300'. In other words, the main light emitting diode 300 and the third repair LED 300' may be disposed on the same anode pad 410 and the same cathode pad 420 in the X direction. That is, when the defect is detected in the main light emitting diode 300, the anode 310' of the third repair LED 300' may be connected to the anode pad 410, and the cathode 320' of the third repair LED 300' may be connected to the cathode pad 420.

In addition, the structure of the electrode pad for mounting the light emitting diode may be modified in various embodiments. For example, the red light emitting diode 300R and the green light emitting diode 300G may share the cathode pad, and the blue light emitting diode 300B may be connected to the separate cathode pad. That is, at least one cathode pad may be provided. In addition, the anode pad may be shared and the plurality of cathode pads may be provided.

The manufacturing method of the display apparatus described above may be executed by various manufacturing apparatuses and/or manufacturing systems. The manufacturing apparatuses and/or manufacturing systems may include the inspection apparatus for detecting the defective LEDs. Further, the manufacturing apparatuses and/or the manufacturing systems may include a computing device that executes computer programs.

The manufacturing method of the display apparatus according to an embodiment may be implemented as the computer programs executed by a computer. The computer programs may be stored on a non-transitory computer readable recording medium.

The computer program according to an embodiment may be stored in the recording medium to execute the manufacturing method of the display apparatus, and may be executed in combination with the computing device. The manufacturing method of the display apparatus executed in combination with the computing device may include preparing a sapphire substrate including a plurality of light emitting diodes (LEDs); performing a first repair process of detecting and removing a first defective LED from among the plurality of LEDs; preparing an interposer substrate including electrode patterns and an adhesive material; attaching the plurality of LEDs to the electrode patterns and separating the sapphire substrate; and performing a second repair process of detecting and repairing a second defective LED among the plurality of LEDs.

The manufacturing method of the display apparatus may further include attaching the plurality of LEDs on the interposer substrate to a carrier substrate and separating the interposer substrate; transferring the plurality of LEDs on the carrier substrate to a backplane; and performing a third repair process of detecting and repairing a third defective LED among the plurality of LEDs transferred to the backplane.

The performing of the first repair process may include detecting the first defective LED by performing a photoluminescence (PL) inspection.

The performing of the second repair process may include, based on the first defective LED being removed in the first repair process, attaching a first repair LED to the electrode patterns of the interposer substrate and then performing an electroluminescence (EL) inspection; and based on the second defective LED being detected by performing the EL inspection, replacing the second defective LED with a second repair LED.

The performing of the third repair process may include performing an electroluminescence (EL) inspection; and mounting a third repair LED corresponding to the third defective LED in a repair area of the backplane.

According to embodiments of the manufacturing method of the display apparatus, the interposer substrate, and the computer program stored in the recording medium to execute the manufacturing method of the display apparatus, a defective light emitting diode can be detected more accurately in the process of manufacturing the display apparatus, and the defect rate of the display apparatus can be minimized.

In addition, according to embodiments of the manufacturing method of the display apparatus, the interposer substrate, and the computer program stored in the recording medium to execute the manufacturing method of the display apparatus, the number of final repairs for repairing the light emitting diode transferred to the backplane can be minimized, and a risk of damage due to the final repair can be reduced.

In addition, according to embodiments of the manufacturing method of the display apparatus, the interposer substrate, and the computer program stored in the recording medium to execute the manufacturing method of the display apparatus, the number and size of electrode pads provided on the backplane for final repair can be reduced. Accordingly, the pixel size of the display apparatus can be reduced and high resolution may be provided.

A display module according to embodiments of the disclosure, as a single unit, can be applied to a wearable device, a portable device, a handheld device, an electronic product, and/or an electrical equipment that use displays, and may be applied to display apparatuses such as monitors for personal computers (PCs), high-resolution TVs, signage, and electronic displays, through a plurality of assembly arrangements in a matrix type.

Although a few embodiments have been shown and described, it will be appreciated by those skilled in the art that changes may be made to these embodiments without departing from the principles and spirit of the disclosure, the scope of which is defined in the claims and their equivalents.

What is claimed is:

1. A method of manufacturing a display apparatus comprising:
   performing a first repair process of detecting a first defective light emitting diode (LED) provided on a sapphire substrate and removing the first defective LED so that a first plurality of LEDs remain on the sapphire substrate;
   attaching the first plurality of LEDs to electrode patterns of an interposer substrate and separating the sapphire substrate from the first plurality of LEDs; and
   performing a second repair process of detecting a second defective LED among the first plurality of LEDs that have been separated from the sapphire substrate and are attached to the electrode patterns, and replacing the second defective LED with a second repair LED so that a second plurality of LEDs are provided on the interposer substrate, wherein the second repair LED is one of the second plurality of LEDs.

2. The method according to claim 1, further comprising:
   attaching the second plurality of LEDs, that are attached to the electrode patterns of the interposer substrate, to a carrier substrate and separating the interposer substrate from the second plurality of LEDs;
   transferring the second plurality of LEDs attached to the carrier substrate to a backplane; and
   performing a third repair process of detecting a third defective LED among the second plurality of LEDs transferred to the backplane and repairing a subpixel corresponding to the third defective LED,
   wherein the backplane includes main areas in which the second plurality of LEDs are disposed, and a repair area in which a third repair LED is mountable.

3. The method according to claim 1, wherein the first repair process comprises detecting the first defective LED by performing a photoluminescence (PL) inspection.

4. The method according to claim 1, wherein an adhesive material is provided over the electrode patterns of the interposer substrate or the electrode patterns are provided on the adhesive material applied to the interposer substrate.

5. The method according to claim 1, wherein the attaching of the first plurality of LEDs to the electrode patterns of the interposer substrate comprises:
- connecting an anode of each of the first plurality of LEDs to a first electrode of the electrode patterns; and
- connecting a cathode of each of the first plurality of LEDs to a second electrode of the electrode patterns.

6. The method according to claim 1, wherein the second repair process comprises, based on the first defective LED being removed in the first repair process, attaching a first repair LED to the electrode patterns of the interposer substrate and then performing an electroluminescence (EL) inspection.

7. The method according to claim 6, wherein the second repair process further comprises:
- based on the second defective LED being detected by performing the EL inspection, replacing the second defective LED with the second repair LED.

8. The method according to claim 1, further comprising attaching the second plurality of LEDs to a backplane that includes main areas in which the second plurality of LEDs are disposed, and a repair area in which a third repair LED is mountable.

9. The method according to claim 8, wherein the backplane comprises:
- a plurality of anode pads configured to be connected to anodes of the second plurality of LEDs;
- repair anode pads; and
- at least one cathode pad configured to be connected to cathodes of the second plurality of LEDs and be connected to a cathode of the third repair LED.

10. The method according to claim 8, further comprising:
performing an electroluminescence (EL) inspection; and
mounting the third repair LED in the repair area.

11. The method according to claim 10, further comprising cutting a third defective LED.

12. An interposer substrate comprising:
- a substrate;
- a first electrode pattern provided on the substrate and configured to be connected to an anode of each of a plurality of light emitting diodes (LEDs) provided on a sapphire substrate and to supply power to the plurality of LEDs;
- a second electrode pattern provided on the substrate and configured to be connected to a cathode of each of the plurality of LEDs provided on the sapphire substrate; and
- an adhesive material configured to provide an adhesive force for attaching the plurality of LEDs to the first electrode pattern and the second electrode pattern.

13. The interposer substrate according to claim 12, wherein the adhesive material is disposed over the first electrode pattern and the second electrode pattern.

14. The interposer substrate according to claim 12, wherein the adhesive material is disposed between the substrate and the first electrode pattern and the second electrode pattern.

15. A non-transitory computer readable recording medium storing a computer program which is executed by a computing device to perform a method of manufacturing a display apparatus, the method comprising:
- performing a first repair process of detecting a first defective light emitting diode (LED) provided on a sapphire substrate and removing the first defective LED so that a first plurality of LEDs remain on the sapphire substrate;
- attaching the first plurality of LEDs to electrode patterns of an interposer substrate and separating the sapphire substrate from the first plurality of LEDs; and
- performing a second repair process of detecting a second defective LED among the first plurality of LEDs that have been separated from the sapphire substrate and are attached to the electrode patterns and replacing the second defective LED with a second repair LED so that a second plurality of LEDs are provided on the interposer substrate, wherein the second repair LED is one of the second plurality of LEDs.

16. The non-transitory computer readable recording medium according to claim 15, wherein the method further comprises:
- attaching the second plurality of LEDs, that are attached to the electrode patterns of the interposer substrate, to a carrier substrate and separating the interposer substrate from the second plurality of LEDs;
- transferring the second plurality of LEDs attached to the carrier substrate to a backplane; and
- performing a third repair process of detecting a third defective LED among the second plurality of LEDs transferred to the backplane and repairing a sub-pixel corresponding to the third defective LED.

17. The non-transitory computer readable recording medium according to claim 15, wherein the performing of the first repair process comprises:
- detecting the first defective LED by performing a photoluminescence (PL) inspection.

18. The non-transitory computer readable recording medium according to claim 15, wherein the performing of the second repair process comprises:
- based on the first defective LED being removed in the first repair process, attaching a first repair LED to the electrode patterns of the interposer substrate and then performing an electroluminescence (EL) inspection; and
- based on the second defective LED being detected by performing the EL inspection, replacing the second defective LED with the second repair LED.

19. The non-transitory computer readable recording medium according to claim 16, wherein the performing of the third repair process comprises:
- performing an electroluminescence inspection; and
- mounting a third repair LED corresponding to the third defective LED in a repair area of the backplane.

20. The interposer substrate according to claim 12, wherein the plurality of LEDs comprises a first LED and a second LED, and
- wherein each of the first electrode pattern and the second electrode pattern extends on the substrate between the first LED and the second LED.

* * * * *